US009074877B2

(12) United States Patent
Sato et al.

(10) Patent No.: US 9,074,877 B2
(45) Date of Patent: Jul. 7, 2015

(54) POSITIONAL DEVIATION DETECTION UNIT, LIGHT EMITTING DEVICE, ILLUMINATION APPARATUS, PROJECTOR, VEHICLE HEADLAMP, AND POSITIONAL DEVIATION ADJUSTMENT METHOD

(75) Inventors: Rina Sato, Osaka (JP); Katsuhiko Kishimoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/235,914

(22) PCT Filed: Jul. 23, 2012

(86) PCT No.: PCT/JP2012/068632
§ 371 (c)(1),
(2), (4) Date: Jan. 29, 2014

(87) PCT Pub. No.: WO2013/024668
PCT Pub. Date: Feb. 21, 2013

(65) Prior Publication Data
US 2014/0204398 A1 Jul. 24, 2014

(30) Foreign Application Priority Data

Aug. 12, 2011 (JP) .................................. 2011-177215
Nov. 9, 2011 (JP) .................................. 2011-245923

(51) Int. Cl.
*G01B 11/14* (2006.01)
*B60Q 1/00* (2006.01)
(Continued)

(52) U.S. Cl.
CPC .............. *G01B 11/14* (2013.01); *B60Q 1/0023* (2013.01); *B60Q 11/005* (2013.01);
(Continued)

(58) Field of Classification Search
CPC ............ G01N 21/645; G01N 21/6486; G01N 15/1429; G01N 15/1434; G01N 15/1459; G01N 2015/1006; G01N 2015/1438; G01N 2015/149; G01N 2021/551; G01N 2021/6419; G01N 2021/6421; G01N 2021/6441
See application file for complete search history.

(56) References Cited

U.S. PATENT DOCUMENTS 4,009,966 A * 3/1977 Craig ............................ 356/123
5,633,710 A * 5/1997 Kumra et al. ............ 356/139.08
(Continued)

FOREIGN PATENT DOCUMENTS

JP    2000-174346 A    6/2000
JP    2003-295319 A    10/2003
(Continued)

OTHER PUBLICATIONS

Official Communication issued in International Patent Application No. PCT/JP2012/068632, mailed on Oct. 23, 2012.

*Primary Examiner* — Michael P Stafira
(74) *Attorney, Agent, or Firm* — Keating & Bennett, LLP

(57) ABSTRACT

A positional deviation detection unit (20) includes a detection portion (21) that detects a relative positional relationship between a laser element (24), a condensing lens (27), and a light emitting portion (3), and a determination portion (22) that compares a detection result from the detection portion (21) with a reference relative positional relationship which is used as a reference for the relative positional relationship, so as to determine whether or not there is a deviation of the relative positional relationship between the laser element (24), the condensing lens (27), and the light emitting portion (3) when the detection portion (21) performs the detection, from the reference relative positional relationship.

13 Claims, 17 Drawing Sheets

(51) Int. Cl.
  *B60Q 11/00* (2006.01)
  *F21S 8/10* (2006.01)
  *F21V 13/08* (2006.01)
  *F21V 7/06* (2006.01)
  *F21V 9/16* (2006.01)
  *H01S 5/00* (2006.01)

(52) U.S. Cl.
  CPC ........ *F21S 48/1159* (2013.01); *F21S 48/1208* (2013.01); *F21V 13/08* (2013.01); *F21V 7/06* (2013.01); *F21V 9/16* (2013.01); *H01S 5/005* (2013.01); *H01S 5/0078* (2013.01)

(56) References Cited

U.S. PATENT DOCUMENTS

2005/0146725 A1* 7/2005 Hansen et al. ................ 356/446
2008/0309914 A1* 12/2008 Cantin et al. ................. 356/4.01
2010/0080016 A1   4/2010 Fukui et al.
2011/0063115 A1   3/2011 Kishimoto
2011/0157865 A1   6/2011 Takahashi et al.
2012/0051074 A1*  3/2012 Takahashi ..................... 362/509
2013/0314711 A1* 11/2013 Cantin et al. ................. 356/445
2014/0168940 A1*  6/2014 Shiomi et al. .................. 362/84

FOREIGN PATENT DOCUMENTS

| JP | 2004-327361 A | 11/2004 |
| JP | 2005-326603 A | 11/2005 |
| JP | 2010-81957 A  |  4/2010 |
| JP | 2010-92747 A  |  4/2010 |
| JP | 2011-66069 A  |  3/2011 |
| JP | 2011-124189 A |  6/2011 |
| JP | 2011-154995 A |  8/2011 |

* cited by examiner

US 9,074,877 B2

POSITIONAL DEVIATION DETECTION UNIT, LIGHT EMITTING DEVICE, ILLUMINATION APPARATUS, PROJECTOR, VEHICLE HEADLAMP, AND POSITIONAL DEVIATION ADJUSTMENT METHOD

TECHNICAL FIELD

The present invention relates to a light emitting device in which an excitation light source such as a semiconductor laser is combined with a light emitting portion such as a phosphor, and to an illumination apparatus, a projector and a vehicle headlamp having the light emitting device, and further relates to a positional deviation detection unit and a positional deviation adjustment method suitable for use with the light emitting device and the like.

BACKGROUND ART

In recent years, many light emitting devices and illumination apparatuses have appeared in which a semiconductor light emitting element such as a light emitting diode (LED) or a semiconductor laser (laser diode; LD) is used as an excitation light source, and, fluorescence, which is generated by irradiating a light emitting portion including a phosphor with excitation light generated by the excitation light source, is used as illumination light.

A light source device disclosed in PTL 1 is an example of such a light emitting device of the related art. The light source device disclosed in PTL 1 includes a semiconductor laser, a collimator which collimates laser light from the semiconductor laser as parallel beams of light flux, a condenser which collects the laser light of the parallel beams of light flux from the collimator, and a phosphor which absorbs the laser light collected by the condenser and emits incoherent light as spontaneously emitted light. The light source device employs a configuration having a laser light reflection mirror so that coherent laser light does not leak out. In addition, in this light source device, incoherent light emitted from the phosphor is reflected in a specific direction by a visible light reflection mirror so as to become illumination light.

Further, a light source device disclosed in PTL 2 includes a semiconductor laser, an optical fiber which guides excitation light from the semiconductor laser, a wavelength conversion member (that is, a light emitting portion) which is optically connected to an emission end portion of the optical fiber and receives excitation light emitted from the emission end portion so as to emit beams of light flux with different wavelengths, and a holding member which holds the wavelength conversion member and light divergence means disposed on an optical path of the excitation light. In addition, a distance between the emission end portion of the optical fiber and the light divergence means such as a lens or the wavelength conversion member, or a range of an effective region of the light divergence means and the wavelength conversion member is optimized in order to increase use efficiency of excitation light and miniaturize an illumination light emission portion.

Further, PTL 3 discloses a light emitting device in which a GaN-based semiconductor laser which generates laser light (excitation light) with a wavelength of 450 nm is used as an excitation light source, and, a phosphor (light emitting portion), which is excited by the laser light from the excitation light source so as to generate fluorescence (non-excitation light) in a visible range, is combined with the excitation light source.

CITATION LIST

Patent Literature

PTL 1: Japanese Unexamined Patent Application Publication No. 2003-295319 (published on Oct. 15, 2003)
PTL 2: Japanese Unexamined Patent Application Publication No. 2000-174346 (published on Jun. 23, 2000)
PTL 3: Japanese Unexamined Patent Application Publication No. 2010-81957 (published on Apr. 15, 2010)
PTL 4: Japanese Unexamined Patent Application Publication No. 2011-66069 (published on Mar. 11, 2011)

SUMMARY OF INVENTION

Technical Problem

As described above, there is a light emitting device in which a light emitting portion such as a phosphor is made to emit light by using a laser light source as an excitation light source, thereby obtaining illumination light. In this light emitting device, a general case is that the light emitting portion is irradiated with laser light by using an optical member, a representative example of which is a convex lens, for collecting the laser light. In this case, a relative positional relationship between the three members such as the laser light source, the optical member, and the light emitting portion is considerably important.

In other words, in this light emitting device, there is a case where, if a position of any one of the three members is deviated by some chance, that is, the position of each of them is changed from an optimal position, as a result, a state in which laser light is collected on the light emitting portion by the optical member varies. In this case, a light density of the laser light applied to the light emitting portion becomes higher or, conversely, lower than in a desired state.

In this case, needless to say, it is very desirable to prevent a relative positional relationship between the three members from deviating from an optimal positional relationship. In addition, this essentially requires that detection of a deviation of a relative positional relationship between the three members from an optimal positional relationship be possible.

In addition, the above-described deviation of a relative positional relationship is a factor that causes the following problems.
(1) Increase in risk to the eye
(2) Deterioration in the light emitting portion
(3) Variations in emission intensity, chromaticity, and light distribution characteristics of the light emitting portion In a case where light with high energy radiated from a light source having a small light emitting point is incident on the human eye, a light source image is narrowed down to a size of the small light emitting point on the retina. Accordingly, the energy density at an image formation region greatly increases in some cases. For example, a light emitting point size of laser light radiated from a semiconductor laser element may be smaller than 10 µm square, and, thus, if light radiated from the light source is directly incident on the eye, or is incident on the eye in a state in which the small light emitting point is viewed directly or indirectly even using an optical member such as a lens or a mirror, the image formation region on the retina may be damaged.

In order to prevent this, it is necessary to enlarge a size of the light emitting point to a specific finite size or greater (naturally, depending on a light density, but, for example, 1 mm×1 mm or greater).

A size of a light emitting point in a typical high output semiconductor laser is, for example, 1 μm×10 μm. The area thereof is 10 μm$^2$=1.0×10$^{-5}$ mm$^2$. In other words, when compared with a light source whose light emitting point has an area of 1 mm$^2$, the energy density of an image formation region on the retina is increased by 10$^5$ times.

It is possible to increase the size of the image formation region on the retina by increasing a size of the light emitting point. Accordingly, even in a case where light with the same energy is incident on the eye, the energy density on the retina can be reduced.

In addition, when described from the viewpoint of light luminance, a required luminance needs to be in an available range while ensuring safety of the eye.

The light source device disclosed in PTL 1 applies coherent light from the laser diode to the phosphor so as to convert the coherent light into incoherent light. The safety of a person's eye is ensured by this conversion. In addition, in relation to laser light which is not converted into incoherent light in the phosphor and is transmitted through the phosphor, the laser light is prevented from being projected toward an illumination light irradiation side (a direction toward a person's eye) by using a reflection mirror.

However, in PTL 1 to PTL 3, if excitation light from the light source does not reach the light emitting portion due to the light emitting portion deviating from a predetermined location or an optical axis of the excitation light source deviating, the excitation light from the excitation light source may be emitted to outside of the device, and thus a person's eye may be damaged when the excitation light is applied to a person's eye.

In addition, PTL 1 does not disclose a problem in which, when a positional deviation occurs between the semiconductor laser and the phosphor, laser light is concentrated on the phosphor and is thus applied at a high light density as described above. Inherently, PTL 1 does not assume that each position of the semiconductor laser and the phosphor is deviated.

Further, in the light emitting device disclosed in PTL 2, a distance between the emission end portion of the optical fiber and the light divergence means such as a lens or the wavelength conversion member, or a range of an effective region of the light divergence means and the wavelength conversion member is optimized in order to increase use efficiency of excitation light and miniaturize an illumination light emission portion.

However, the light emitting devices disclosed in PTLs 2 and 3 are not aimed at solving the problems of the above (1) to (3), and cannot adjust a position of each of the semiconductor laser and the phosphor as in PTL 1.

In addition, the above problems are not limited to a case where an excitation light source is a semiconductor laser, and occur in an excitation light source which does not have characteristics unique to a semiconductor laser, for example, a light emitting diode (LED) or the like as long as the excitation light source can generate high output.

Further, PTL 4 discloses a light emitting device including a light receiving element which measures an emission intensity of a phosphor so as to prevent oscillated coherent laser light from a semiconductor laser element from being emitted to outside, and a control portion which stops driving of the laser element when a light intensity (a value of a current flowing through the light receiving element) detected by the light receiving element is equal to or less than a predetermined value.

The present invention has been made in consideration of the above-described problems, and an object thereof is to provide a light emitting device and an illumination apparatus capable of preventing excitation light from being emitted to outside of the apparatus, in a case where a light emitting portion is deviated or a position of an excitation light source is deviated and thus the excitation light does not arrive at the light emitting portion from the excitation light source, in order to ensure safety of a person's eye in the illumination apparatus in which the excitation light from the excitation light source is applied to the light emitting portion so as to emit non-excitation light from the light emitting portion, and the non-excitation light is used as illumination light, to provide a vehicle headlamp including the illumination apparatus, to provide a positional deviation detection unit which is included in the illumination apparatus and detects a deviation of a relative positional relationship between the excitation light source, the optical member, and the light emitting portion, and to provide a positional deviation adjustment method and a projector.

Solution to Problem

In order to solve the above-described problems, a positional deviation detection unit according to the present invention includes detection means for detecting a relative positional relationship between an excitation light source, an optical member, and a light emitting portion in a light emitting device in which excitation light emitted from the excitation light source is collected at the light emitting portion via the optical member so that the light emitting portion is made to emit light; and determination means for comparing a detection result from the detection means with a reference relative positional relationship which is used as a reference for the relative positional relationship between the excitation light source, the optical member, and the light emitting portion, so as to determine whether or not there is a deviation of the relative positional relationship between the excitation light source, the optical member, and the light emitting portion when the detection means performs the detection, from the reference relative positional relationship.

According to the above configuration, the detection unit can detect a deviation of a relative positional relationship between the excitation light source, the optical member, and the light emitting portion from a reference relative positional relationship therebetween in the light emitting device in which excitation light which is emitted from the excitation light source and is collected through the optical member is applied to the light emitting portion so that the light emitting portion is made to emit light. For example, it is possible to detect a deviation even in a case where a relative positional relationship between the excitation light source, the optical member, and the light emitting portion is deviated due to the movement of a luminaire or a vehicle having the light emitting device mounted therein.

In addition, in order to solve the above-described problems, a light emitting device according to the present invention includes an excitation light source that emits excitation light; an optical member that collects the excitation light emitted from the excitation light source; a light emitting portion that is made to emit light by using the excitation light collected by the optical member; a positional deviation detection unit that detects a deviation in a relative positional relationship between the excitation light source, the optical member, and the light emitting portion; and a positional deviation adjustment unit that adjusts the deviation detected by the positional deviation detection unit, in which the positional deviation detection unit includes detection means for detecting a relative positional relationship between the excitation light source, the optical member, and the light emitting portion; and determination means for comparing a detection result from the detection means with a reference relative positional relationship which is used as a reference for a relative positional relationship between the excitation light source, the optical member, and the light emitting portion, so as to determine whether or not there is a deviation of the relative positional relationship between the excitation light source, the optical member, and the light emitting portion from the reference relative positional relationship when the detection means performs the detection, and in which the positional deviation adjustment unit adjusts a deviation detected by the positional deviation detection unit by returning the relative positional relationship between the excitation light source, the optical member, and the light emitting portion to the reference relative positional relationship when the deviation is detected by the positional deviation detection unit.

According to the above configuration, excitation light which is emitted from the excitation light source and is collected through the optical member is applied to the light emitting portion so that the light emitting portion is made to emit light.

In a case where a relative positional relationship between the excitation light source, the optical member, and the light emitting portion is deviated, the detection portion detects a deviation from a reference relative positional relationship, and the positional deviation adjustment unit returns the relative positional relationship to the reference positional relationship. For example, even in a case where a relative positional relationship between the excitation light source, the optical member, and the light emitting portion is deviated due to the movement of a luminaire or a vehicle having the light emitting device mounted therein, the positional deviation adjustment unit returns the relative positional relationship to the reference relative positional relationship again. For this reason, even in a case where the above-described deviation occurs, it is possible to continuously irradiate the light emitting portion with excitation light at a desired position and in a desired range.

Accordingly, it is possible to delay deterioration in the light emitting portion due to the excitation light being applied to the light emitting portion in a more concentrated manner than in a desired state, to prevent luminance from being greatly increased, or to prevent danger from the viewpoint of eye safety. Here, the eye safety indicates safety of a human eye. In addition, conversely, it is also possible to prevent desired optical characteristics from not being obtained due to luminance being lowered when the excitation light is applied to the light emitting portion in a less concentrated manner than in the desired state.

In addition, in order to solve the above-described problems, a light emitting device according to the present invention includes an excitation light source that emits excitation light; an optical member that collects the excitation light emitted from the excitation light source; a light emitting portion that is made to emit light by using the excitation light collected by the optical member; and an elastic member that maintains a relative positional relationship between the excitation light source, the optical member, and the light emitting portion.

According to the above configuration, excitation light which is emitted from the excitation light source and is collected through the optical member is applied to the light emitting portion so that the light emitting portion is made to emit light.

Here, a relative positional relationship between the excitation light source, the optical member, and the light emitting portion is maintained by an elastic force of the elastic member such as, for example, a spring. Specifically, even in a case where a relative positional relationship between the excitation light source, the optical member, and the light emitting portion is deviated, the relative positional relationship is returned to the reference relative positional relationship by the elastic force of the elastic member. For this reason, even in a case where the above-described deviation occurs, it is possible to irradiate the light emitting portion with excitation light at a desired position and in a desired range.

Therefore, it is possible to delay deterioration in the light emitting portion due to the excitation light being applied to the light emitting portion in a more concentrated manner than in a desired state, to prevent luminance from being greatly increased, or to prevent danger from the viewpoint of eye safety. In addition, conversely, it is also possible to prevent desired optical characteristics from not being obtained due to luminance lowered when the excitation light is applied to the light emitting portion in a less concentrated manner than in the desired state.

Further, a positional deviation adjustment method according to the present invention includes a positional deviation detection step of detecting a relative positional relationship between an excitation light source, an optical member, and a light emitting portion in a light emitting device in which excitation light emitted from the excitation light source is collected at the light emitting portion via the optical member so that the light emitting portion is made to emit light; and a positional deviation adjustment step of adjusting a deviation detected in the positional deviation detection step, in which the positional deviation detection step includes a detection step of detecting a relative positional relationship between the excitation light source, the optical member, and the light emitting portion; and a determination step of comparing a detection result obtained in the detection step with a reference relative positional relationship which is used as a reference for a relative positional relationship between the excitation light source, the optical member, and the light emitting portion, so as to determine whether or not there is a deviation of the relative positional relationship between the excitation light source, the optical member, and the light emitting portion when the detection is performed in the detection step, from the reference relative positional relationship, and in which, in the positional deviation adjustment step, a deviation detected in the positional deviation detection step is adjusted by returning the relative positional relationship between the excitation light source, the optical member, and the light emitting portion to the reference relative positional relationship when the deviation is detected in the positional deviation detection step.

According to the above configuration, excitation light which is emitted from the excitation light source and is collected through the optical member is applied to the light emitting portion so that the light emitting portion is made to emit light.

In a case where a deviation of a relative positional relationship between the excitation light source, the optical member, and the light emitting portion is detected based on a deviation from a reference relative positional relationship, the relative positional relationship is returned to the reference relative positional relationship according to the positional deviation adjustment method. For example, even in a case where a relative positional relationship between the excitation light source, the optical member, and the light emitting portion is deviated due to the movement of a luminaire or a vehicle having the light emitting device mounted therein, the relative positional relationship is returned to the reference relative positional relationship again according to the positional deviation adjustment method. For this reason, even in a case where the above-described deviation occurs, it is possible to irradiate the light emitting portion with excitation light at a desired position and in a desired range.

Therefore, it is possible to delay deterioration in the light emitting portion due to the excitation light being applied to the light emitting portion in a more concentrated manner than in a desired state, to prevent luminance from being greatly increased, or to prevent danger from the viewpoint of eye safety. In addition, conversely, it is also possible to prevent desired optical characteristics from not being obtained due to luminance lowered when the excitation light is applied to the light emitting portion in a less concentrated manner than in the desired state. Further, it is possible to prevent danger in which a position of the light emitting portion or an emission direction of excitation light is deviated, and thus the excitation light is emitted as illumination light such that the illumination light enters a person's eye.

In addition, an illumination apparatus, a projector, and a vehicle headlamp provided with the light emitting device are also included in the technical scope of the present invention.

In addition, in order to solve the above-described problems, an illumination apparatus according to the present invention includes an excitation light source that emits excitation light in one direction; a light emitting portion that receives the excitation light and as a result emits non-excitation light; and a reflective portion that reflects the non-excitation light in an illumination direction which is different from an emission direction of the excitation light.

According to the above configuration, excitation light from the excitation light source is converted into non-excitation light by the light emitting portion, and the non-excitation light is emitted as illumination light. Therefore, it is possible to obtain illumination light with high luminance by using the excitation light source.

In addition, an emission direction of excitation light is set to be different from an illumination direction of illumination light. Therefore, it is possible to prevent the excitation light from being emitted in the illumination direction (that is, the excitation light from being emitted as illumination light) even if a position of the light emitting portion or an emission direction of the excitation light is deviated and thus the excitation light is out of the light emitting portion.

In addition, a vehicle headlamp provided with the illumination apparatus is also included in the technical scope of the present invention. Surrounding people can recognize the presence of a vehicle even if the excitation light source does not irradiate the light emitting portion in the vehicle headlamp.

Advantageous Effects of Invention

According to the present invention, there is an achievement of an effect in which a deviation of a relative positional relationship between the excitation light source, the optical member, and the light emitting portion can be detected in the light emitting device in which excitation light emitted from the excitation light source is collected at the light emitting portion through the optical member, and the light emitting portion is made to emit light.

In addition, the illumination apparatus of the present invention includes the excitation light source that emits excitation light in one direction, the light emitting portion that receives the excitation light so as to emit non-excitation light, and the reflective portion that reflects the non-excitation light in an illumination direction which is different from an emission direction of the excitation light.

Accordingly, there is an achievement of an effect in which it is possible to prevent the excitation light from being emitted in the illumination direction (that is, prevent the excitation light from being emitted as illumination light) even if a position of the light emitting portion or an emission direction of the excitation light is deviated and thus the excitation light is out of the light emitting portion.

BRIEF DESCRIPTION OF DRAWINGS

FIG. 9 is a diagram illustrating a configuration of a semiconductor laser unit used in the light emitting device according to another embodiment of the present invention, in which FIG. 9(a) is a diagram illustrating a positional relationship between the semiconductor laser unit and the light emitting portion, and FIG. 9(b) is a diagram illustrating an exterior of the semiconductor laser unit.

FIG. 17 is a diagram illustrating a positional relationship between a light emitting portion, a metal plate, and an excitation light emitting opening, in which FIG. 17(a) is a conceptual diagram viewed from a direction of an arrow X of FIG. 16, and FIG. 17(b) is a conceptual diagram illustrating a method in which the light emitting portion is disposed on the excitation light emitting opening of the metal plate.

DESCRIPTION OF EMBODIMENTS

Hereinafter, an information terminal related to an embodiment of the present invention will be described. In addition, the information terminal related to the present embodiment is implemented by a mobile phone. Therefore, in the following, the information terminal related to the present embodiment is simply referred to as a mobile phone.

However, the present invention is not limited to the mobile phone, and is generally applicable to information terminals having a security function.

Hereinafter, an embodiment of the present invention will be described with reference to FIGS. 1 and 2.

[Embodiment 1]

<Configuration of Light Emitting Device 101>

Figure 1:
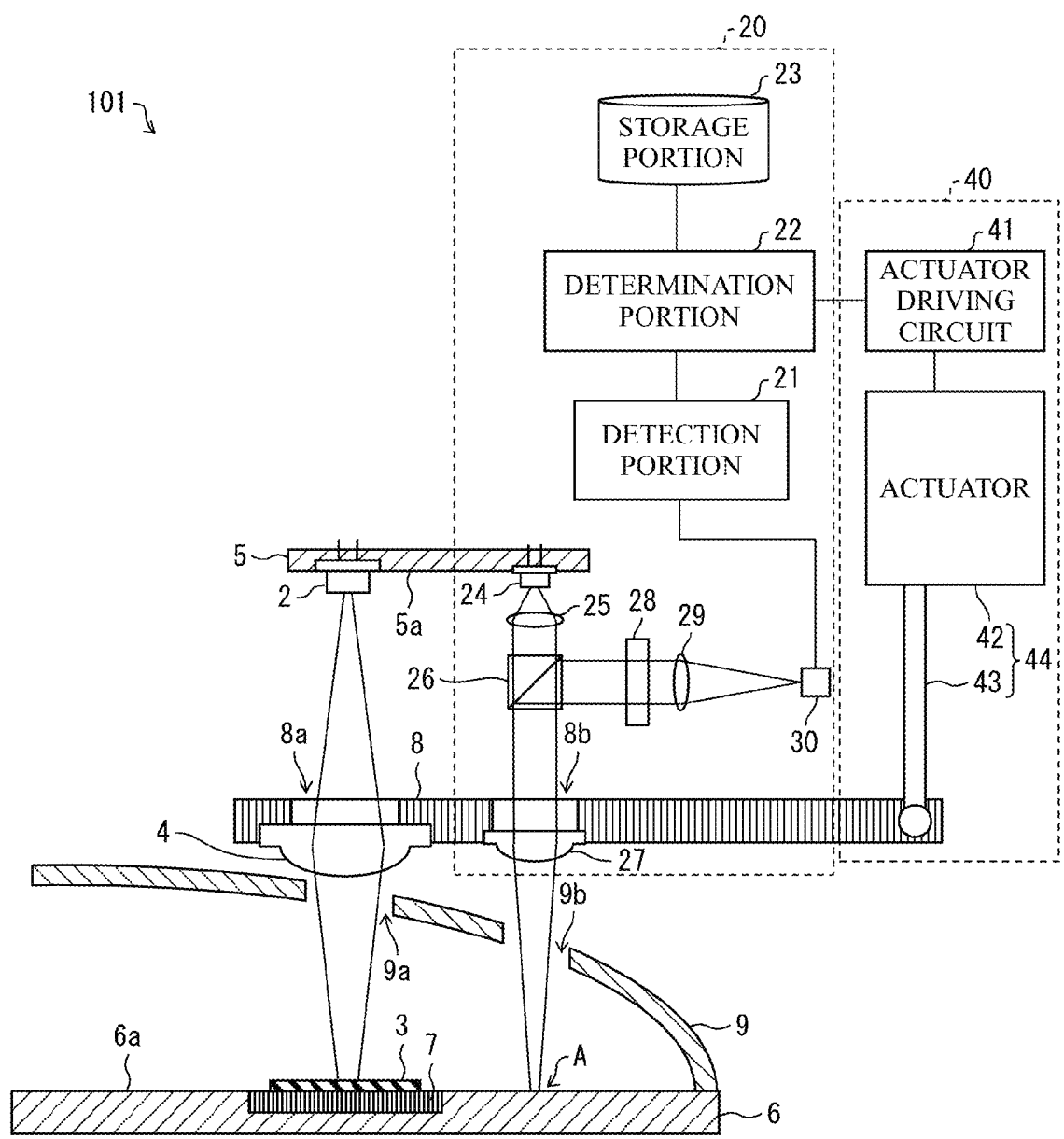
FIG. 1 is a diagram illustrating a configuration of a light emitting device according to an embodiment of the present invention.

FIG. 1 is a cross-sectional view illustrating a schematic configuration of a light emitting device 101 according to an embodiment of the present invention. As illustrated in FIG. 1, the light emitting device 101 includes a laser element (an excitation light source, or a semiconductor laser) 2, a light emitting portion 3, a condensing lens (an optical member) 4, a laser element support member (an excitation light source support member) 5, a metal base (a light emitting portion support member) 6, a heat dissipation plate 7, a condensing lens support member (an optical member support member) 8, a reflection mirror 9, a positional deviation detection unit 20, and a positional deviation adjustment unit 40.

(Laser Element 2)

The laser element 2 is a light emitting element which functions as an excitation light source which emits excitation light. The laser element 2 may be provided in a plurality. In this case, laser light is oscillated as excitation light from each of a plurality of laser elements 2.

The laser element 2 may have a single light emitting point in a single chip, or may have a plurality of light emitting points in a single chip. A wavelength of laser light of the laser element 2 is, for example, 405 nm (bluish violet) or 450 nm (blue), but is not limited thereto, and may be appropriately selected depending on the kind of phosphor included in the light emitting portion 3.

In addition, a light emitting diode (LED) may be used as an excitation light source (a light emitting element) instead of the laser element 2.

In the present embodiment, a light source was used in which twenty arranged semiconductor laser chips, each of which has a wavelength of 405 nm and output power of 500 mW, are mounted in one package.

The laser element 2 is supported by the laser element support member 5. Specifically, the laser element 2 is disposed on a laser element support surface (an excitation light source support surface) 5a which is a main surface of the laser element support member 5 facing the light emitting portion 3, and emits laser light toward the light emitting portion 3.

The laser element support member 5 is equipped with, for example, a driving circuit (not illustrated) that drives the laser element 2, and the driving circuit supplies a driving current so as to drive the laser element 2.

(Light Emitting Portion 3)

The light emitting portion 3 receives laser light which is emitted from the laser element 2 and is collected by the condensing lens 4, and generates fluorescence. The light emitting portion 3 includes a phosphor (a fluorescent material) which receives laser light so as to emit light. Specifically, the light emitting portion 3 is formed by dispersing a phosphor inside a sealing material, by pressing and fixing a phosphor, by pressing and fixing a phosphor and performing heat treatment thereon, or by depositing a phosphor and then performing an appropriate post-process such as heat treatment thereon. The light emitting portion 3 converts laser light into fluorescence and thus can be said to be a wavelength conversion element.

The light emitting portion 3 is disposed on the heat dissipation plate 7 and substantially at a focal position of the reflection mirror 9. For this reason, fluorescence emitted from the light emitting portion 3 is reflected at the reflective curved surface of the reflection mirror 9, and thus an optical path thereof is controlled. An antireflection structure which prevents reflection of light from the excitation light source may be formed on the upper surface and side surfaces of the light emitting portion 3.

In addition, an irradiation range of illumination light may be intentionally widened or narrowed by disposing the light emitting portion 3 at a position deviating from the focal position.

As the phosphor of the light emitting portion 3, for example, an oxynitride phosphor (for example, SiAlON), a nitride phosphor (for example, CASN), or a group III-V compound semiconductor nanoparticle phosphor (for example, InP) may be used. Such a phosphor has high heat resistance to laser light with high output power (and/or light density) which is generated from the laser element 2, and is the best substance for a laser illumination light source. However, a phosphor of the light emitting portion 3 is not limited to the above-described ones, and may be other phosphor such as an oxide phosphor or a sulfide phosphor.

When the light emitting device is used as a headlamp, it is stipulated by law that illumination light of the headlamp should be white with chromaticity in a predetermined range. For this reason, the light emitting portion 3 includes a phosphor selected so that illumination light is white.

For example, when blue, green and red phosphor are included in the light emitting portion 3 and are irradiated with laser light of 405 nm, white light is generated. Alternatively, a yellow phosphor (or green and red phosphor) is included in the light emitting portion 3 and is irradiated with laser light of 450 nm (blue) (or so-called near blue laser light with a peak wavelength in a wavelength range of 440 nm or greater and 490 nm or less), thereby also obtaining white light.

A sealing material of the light emitting portion 3 is, for example, a glass material (inorganic glass and organic-inorganic hybrid glass) or a resin material such as a silicone resin. Low-melting glass may be used as a glass material. The sealing material preferably has considerably high transparency in a wavelength region of around 405 nm which is a wavelength of excitation light and a wavelength region of an emission spectral region of a phosphor, and preferably has high heat resistance in a case where laser light has a high output level.

In the present embodiment, CASN:Eu which is a nitride phosphor and Ca-αSiAlON:Ce which is an oxynitride phosphor were used as a fluorescent substance, and low-melting glass was used as a sealing material. A mixture with a weight ratio of (CASN:Eu):(Ca-αSiAlON:Ce)=1:3 was deposited on the heat dissipation plate 7 through electrophoresis, thereby obtaining a cuboidal deposit of the phosphor having a size of 10 mm square and a thickness of 0.5 mm. Further, the deposit of the phosphor was covered with powder of the low-melting glass to an extent that a surface thereof was covered, and the deposit of the phosphor was sealed by performing heat treatment at a temperature of a glass softening point or higher of the low-melting glass, thereby obtaining the light emitting portion.

The light emitting portion 3 is supported by the metal base 6 via the heat dissipation plate 7. Specifically, the light emitting portion 3 is disposed on a light emitting portion support surface 6a of the metal base 6 facing the laser element 2. The light emitting portion 3 receives laser light emitted from the laser element 2, and is made to emit light by using the laser light.

A hole in which to embed the heat dissipation plate 7 is provided in the light emitting portion support surface 6a. The light emitting portion 3 is disposed so as to be in direct contact with the heat dissipation plate 7. The heat dissipation plate 7 has a function of dissipating heat which is generated from the light emitting portion 3 due to irradiation with laser light emitted from the laser element 2.

Copper was used as the heat dissipation plate 7. The copper used a cuboid with a size of 20 mm square and a thickness of 2 mm. In addition, an aluminum block having a hole in which to embed the heat dissipation plate 7 was used as the metal base 6. The aluminum block was a cuboid with a size of 40 mm square and a thickness of 5 mm. The gap between the heat dissipation plate 7 and the hole of the metal base 6 was filled with a heat conductive elastomer so that heat generated in the light emitting portion 3 irradiated with laser light is conducted to the heat dissipation plate 7, and thus the heat conducted to the heat dissipation plate 7 easily propagates to the metal base 6. In addition, the surface on the side having the hole was formed as a mirror surface.

Since the side of the metal base 6 having the hole is required to be irradiated with laser light and to reflect the laser light as described later, a material, which resists heat and reflects laser light with a reflectance of 50% or more, is preferably used therein. In addition, since a mirror surface is required to be provided only at an irradiation position, other materials may be used as long as such a condition is satisfied.

(Condensing Lens 4)

The condensing lens 4 is a lens that collects laser light so that the laser light emitted from the laser element 2 is applied to the light emitting portion 3 as a circular or elliptical spot.

Examples of the condensing lens 4 may include a biconvex lens, a plano-convex lens, a convex meniscus lens, and the like having a convex surface for the light emitting portion 3.

Further, in addition to the above-described example, a combination of independent lenses having a concave surface and a convex surface with any axis, a combination of independent lenses having a convex surface and a convex surface with any axis, and the like may be employed in accordance with a shape of the light emitting portion 3, the number of laser elements 2, or light distribution characteristics of laser light emitted from the laser element 2.

Accordingly, an appropriate combination of lenses is employed in accordance with a shape of the light emitting portion 3, the number of laser elements 2, or light distribution characteristics of laser light emitted from the laser element 2, and thus it is possible to increase emission efficiency of the light emitting portion 3.

In addition, a composite lens obtained by integrating lenses having a concave surface and a convex surface with any axis, a composite lens obtained by integrating lenses obtained by integrating composite lenses having a convex surface and a convex surface with any axis, or the like may be employed in accordance with a shape of the light emitting portion 3, the number of laser elements 2, or light distribution characteristics of laser light emitted from the laser element 2.

Accordingly, the number of components of the overall optical system is reduced so as to reduce a size of the overall optical system, and an appropriate composite lens is employed in accordance with a shape of the light emitting portion 3, the number of laser elements 2, or light distribution characteristics of laser light emitted from the laser element 2, thereby increasing emission efficiency of the light emitting portion 3.

In the present embodiment, a convex lens with a diameter of 20 mm was used.

The condensing lens 4 is supported by the condensing lens support member 8. An opening 8a is provided in the condensing lens support member 8. Laser light emitted from the laser element 2 travels from the laser element 2 side of the condensing lens support member 8 to the light emitting portion 3 side through the opening 8a. The condensing lens 4 covers the opening 8a of the condensing lens support member 8, and is disposed on the main surface of the condensing lens support member 8. In the light emitting device 101, the condensing lens 4 is disposed on one main surface of the condensing lens support member 8 facing the light emitting portion 3, but may be disposed on the main surface of the condensing lens support member 8 facing the laser element 2.

The condensing lens 4 collects laser light which is emitted from the laser element 2 and passes through the opening 8a, and applies the laser light to the light emitting portion 3.

(Reflection Mirror 9)

The reflection mirror 9 reflects fluorescence generated by the light emitting portion 3 so as to form beams of light flux (illumination light) which travel at a solid angle within a predetermined range.

In addition, the reflection mirror 9 also reflects light which is reflected or scattered by the light emitting portion 3 of the excitation light beams applied to the light emitting portion 3, so as to form beams of light flux (illumination light) traveling within a predetermined solid angle. Here, the term "illumination light" indicates light which is finally emitted from the light emitting device 101, and includes (1) a case where illumination light is formed only by fluorescence generated from the light emitting portion 3 and (2) a case where illumination light is formed by a mixture of fluorescence generated from the light emitting portion 3 and excitation light which is not used for excitation of the phosphor included in the light emitting portion 3 but is reflected or scattered by the light emitting portion 3. The reflection mirror 9 may be a member in which, for example, a metal thin film is formed on the surface thereof, or may be a member made of metal.

The reflection mirror 9 may include at least a part of a curved surface, which is formed by rotating a figure (an ellipse, a circle, or a parabola) with respect to a rotation axis, in the reflective surface thereof.

In the present embodiment, a partial curved surface, which is obtained by cutting a curved surface formed by rotating a parabola with respect to a rotation axis which is a symmetric axis of the parabola on a plane including the rotation axis, is included in the reflective surface thereof.

A part of the reflection mirror 9 with this shape is disposed over the upper surface of the light emitting portion 3 having a larger area than the side surface thereof. In other words, the reflection mirror 9 is disposed at a position covering the upper surface of the light emitting portion 3. When described from another viewpoint, a part of the side surface of the light emitting portion 3 faces an opening of the reflection mirror 9.

A positional relationship between the light emitting portion 3 and the reflection mirror 9 has the above-described positional relationship, and thus fluorescence generated from the light emitting portion 3 can be efficiently projected within a narrow solid angle, thereby increasing use efficiency of fluorescence.

In addition, the reflection mirror 9 is provided with a window 9a and a window 9b which transmit respective laser light beams from the laser element 2 and a laser element 24 therethrough or allow the respective laser light beams to pass therethrough. The window 9a and the window 9b may be openings, or may include a transparent member through which laser light can be transmitted. For example, a transparent plate provided with a filter through which laser light can be transmitted and which reflects white light (fluorescence from the light emitting portion 3) may be provided as the window 9a and the window 9b. In this configuration, it is possible to prevent fluorescence from the light emitting portion 3 from leaking out of the window 9a and the window 9b.

(Positional Deviation Detection Unit 20)

The positional deviation detection unit 20 includes a detection portion (detection means) 21, a determination portion (determination means) 22, a storage portion 23, a laser element 24, a collimator lens 25, a beam splitter (half mirror) 26, a condensing lens 27, a fluorescence cutoff filter (optical function filter) 28, a lens 29, and a light receiving element (light receiving portion) 30.

(Detection Portion 21)

The detection portion 21 detects a relative positional relationship between the laser element 2, the condensing lens 4, and the light emitting portion 3 in the light emitting device 101. The detection portion 21 is connected to the light receiving element 30, and receives a light receiving result from the light receiving element 30. The detection portion 21 detects a relative positional relationship between the laser element 2, the condensing lens 4, and the light emitting portion 3 on the basis of the light receiving result. Specifically, the detection portion 21 detects a relative positional relationship between the laser element 2, the condensing lens 4, and the light emitting portion 3 so that laser light emitted from the laser element 2 is applied to the light emitting portion 3 with a desired irradiation area.

Here, the "relative positional relationship" indicates a relative distance between the laser element 2 and the condensing lens 4, a relative distance between the condensing lens 4 and the light emitting portion 3, and a relative distance between the laser element 2 and the light emitting portion 3, for example, in a case where the laser element 2, the condensing lens 4, and the light emitting portion 3 are disposed in this order as in the light emitting device 101.

For this "relative positional relationship", a "reference relative positional relationship" which is used as a reference is set. Laser light which is emitted from the laser element 2 and is collected via the condensing lens 4 is applied to the light emitting portion 3, and the "reference relative positional relationship" is used as a reference for adjusting the irradiation area with which the laser light is applied to the light emitting portion 3. In a case where a "relative positional relationship" between the laser element 2, the condensing lens 4, and the light emitting portion 3 is a "reference relative positional relationship", laser light emitted from the laser element 2 is applied to the light emitting portion 3 with a desired irradiation area. The laser element 2, the condensing lens 4, and the light emitting portion 3 are disposed so as to be arranged on the same optical axis. The "reference relative positional relationship" becomes a "relative positional relationship" when laser light from the laser element 2 is applied to the light emitting portion 3 at a desired position and with a desired irradiation area.

(Determination Portion 22)

The determination portion 22 compares a detection result from the detection portion 21 with a reference relative positional relationship between the laser element 2, the condensing lens 4, and the light emitting portion 3, and determines whether or not a relative positional relationship between the laser element 2, the condensing lens 4, and the light emitting portion 3 is deviated from the reference relative positional relationship.

When the relative positional relationship between the laser element 2, the condensing lens 4, and the light emitting portion 3, which is the detection result from the detection portion 21, is received, the determination portion 22 acquires reference relative positional relationship information indicating a reference relative positional relationship between the laser element 2, the condensing lens 4, and the light emitting portion 3 stored in the storage portion 23. The determination portion 22 performs the determination by comparing the reference relative positional relationship indicated by the reference relative positional relationship information acquired from the storage portion 23 with the detection result from the detection portion 21.

In this way, the determination portion 22 performs the determination, and outputs the determination result to the positional deviation adjustment unit 40.

In addition, the determination result from the determination portion 22 preferably includes a specific deviation amount, for example, to what extent the relative positional relationship detected by the detection portion 21 is deviated from the reference relative positional relationship. In this case, the positional deviation adjustment unit 40 described later can determine an adjustment amount necessary to return the relative positional relationship detected by the detection portion 21 to the reference relative positional relationship by using the specific deviation amount.

(Storage Portion 23)

The storage portion 23 stores the reference relative positional relationship information indicating a reference relative positional relationship between the laser element 2, the condensing lens 4, and the light emitting portion 3 as described above. The storage portion 23 may use, for example, a nonvolatile semiconductor memory, a hard disk, or the like.

(Laser Element 24)

The laser element (a laser light source) 24 is supported by the laser element support member 5 in the same manner as the laser element 2. Specifically, the laser element 24 is disposed on the laser element support surface 5a of the laser element support member 5, and emits laser light toward the metal base 6 supporting the light emitting portion 3.

A driving circuit (not illustrated) driving the laser element 24 is mounted in, for example, the laser element support member 5, and supplies a driving current to the laser element 24. The laser element 24 emits laser light by using the driving current.

Both of the laser element 2 and the laser element 24 are supported by the laser element support member 5, and thus the laser element 2 and the laser element 24 do not move independently of each other.

(Collimator Lens 25)

The collimator lens 25 converts laser light emitted from the laser element 24 into parallel light. The laser light emitted from the laser element 24 is incident on the collimator lens 25 so as to be converted into parallel light, and is then incident on the beam splitter 26.

(Beam Splitter 26)

When the parallel light emitted from the collimator lens 25 is incident on the beam splitter, the beam splitter 26 transmits the parallel light therethrough without change so as to emit the parallel light toward the condensing lens 27.

In addition, when a reflected light which is reflected from the metal base 6 is incident on the beam splitter, the beam splitter 26 reflects the light toward the light receiving element 30, without transmitting the light therethrough as it is, as described later.

(Condensing Lens 27)

The condensing lens 27 is supported by the condensing lens support member 8 in the same manner as that of the condensing lens 4. The condensing lens support member 8 is provided with an opening 8b. Laser light emitted from the laser element 24 travels from the laser element 24 side of the condensing lens support member 8 to the metal base 6 side through the opening 8b. The condensing lens 27 covers the opening 8b of the condensing lens support member 8 and is disposed on one main surface of the condensing lens support member 8. In the light emitting device 101, the condensing lens 27 is disposed on one main surface of the condensing lens support member 8 facing the metal base 6, but may be disposed on the main surface of the condensing lens support member 8 facing the laser element 24.

The condensing lens 27 collects laser light which is emitted from the laser element 24 and passes through the opening 8b, and applies the laser light to the metal base 6. The laser light applied to the metal base 6 is reflected by the light emitting portion support surface 6a of the metal base 6 (a location indicated by A in FIG. 1), and travels toward the condensing lens 27. The laser light reflected from the light emitting portion support surface 6a passes through the condensing lens 27 and the opening 8b in this order, and is then incident on the beam splitter 26. When the laser light emitted from the condensing lens 27 is incident on the beam splitter, the beam splitter 26 emits the laser light toward the light receiving element 30.

Both of the condensing lens 4 and the condensing lens 27 are supported by the condensing lens support member 8, and thus the condensing lens 4 and the condensing lens 27 do not move independently of each other. In other words, when any one of the condensing lens 4, the condensing lens 27, and the condensing lens support member 8 moves, the other two members move along with the moving member. For this reason, each of the three does not move independently.

(Fluorescence Cutoff Filter 28)

The fluorescence cutoff filter 28 is a filter which blocks fluorescence emitted from the light emitting portion 3 and transmits laser light reflected from the metal base 6 therethrough. The fluorescence cutoff filter 28, as illustrated in FIG. 1, is disposed on the light receiving surface side where the light receiving element 30 receives laser light. In other words, the fluorescence cutoff filter 28 is disposed on an optical path of laser light which travels from the beam splitter 26 toward the light receiving element 30. In this way, fluorescence which leaks out of the window 9a or the window 9b of the reflection mirror 9 described later is made not to be incident on the light receiving element 30, and thus it is possible to prevent operation errors of the light receiving element 30.

(Lens 29)

The lens 29 collects the laser light having passed through the fluorescence cutoff filter 28 at the light receiving element 30.

(Light Receiving Element 30)

The light receiving element 30 is irradiated with laser light emitted from the lens 29. The laser light forms a light spot on a light receiving surface of the light receiving element 30. The light receiving element 30 uses, for example, four photodetectors, and receives laser light applied to each light receiving surface.

The light receiving element 30 outputs an intensity distribution of the laser light received in this way, to the detection portion 21. The detection portion 21 detects a relative positional relationship between the laser element 24, the condensing lens 27, and the metal base 6 (the location indicated by A in FIG. 1) by using the intensity distribution output from the light receiving element 30.

Here, a relative positional relationship between the laser element 24, the condensing lens 27, and the metal base 6 of the positional deviation detection unit 20 is the same as a relative positional relationship between the laser element 2, the condensing lens 4, and the light emitting portion 3. This is because both of the laser element 2 and the laser element 24 are supported by the same laser element support member 5, both of the condensing lens 4 and the condensing lens 27 are supported by the same condensing lens support member 8, and the light emitting portion 3 is supported by the metal base 6. In other words, when the laser element 2 moves, the laser element 24 of the positional deviation detection unit 20 moves in the same direction. When the condensing lens 4 moves, the condensing lens 27 of the positional deviation detection unit 20 moves in the same direction. The meaning of the light emitting portion 3 moving is that the metal base 6 moves.

In this way, the detection portion 21 can indirectly detect a relative positional relationship between the laser element 2, the condensing lens 4, and the light emitting portion 3 by using an intensity of laser light output from the light receiving element 30.

(Reference Relative Positional Relationship)

A reference relative positional relationship may be a relative positional relationship between the laser element 2, the condensing lens 4, and the light emitting portion 3, for example, in a case where a diameter of a light spot is a certain size on the light receiving surface of the light receiving element 30. The detection portion 21 detects a size of the diameter of a light spot as the relative positional relationship. The determination portion 22 may determine that there is a deviation from the reference relative positional relationship when the size of the diameter of the light spot changes from a size of the diameter of the light spot in a case of the reference relative positional relationship.

In addition, the reference relative positional relationship targets a relative positional relationship between three or more objects. For this reason, a reference position in a reference relative positional relationship between the three objects may be not only one but may also be in a plurality. In other words, in order for laser light from the laser element 2 to be applied to the light emitting portion 3 with a certain irradiation area, a relative positional relationship between the laser element 2, the condensing lens 4, and the light emitting portion 3 is not limited to one method.

In a case where one component of the laser element 2, the condensing lens 4, and the light emitting portion 3 is moved from the reference relative positional relationship due to some impact, and thus a relative positional relationship between the two components is deviated from the reference relative positional relationship, the relative positional relationship is returned to the reference relative positional relationship by the positional deviation adjustment unit 40 as described later.

(Positional Deviation Adjustment Unit 40)

The positional deviation adjustment unit 40 includes an actuator driving circuit 41, an actuator 42, and a connection member 43.

(Actuator Driving Circuit 41)

The actuator driving circuit 41 acquires a determination result from the determination portion 22 of the positional deviation detection unit 20. The actuator driving circuit 41 acquires the determination result, and thus recognizes that a relative positional relationship between the laser element 2, the condensing lens 4, and the light emitting portion 3 is deviated from the reference relative positional relationship.

The actuator driving circuit 41 extracts a deviation amount included in the determination result from the determination portion 22. The actuator driving circuit 41 generates, from the deviation amount, a driving signal for performing movement using a movement mechanism 44 constituted by the actuator 42 and the connection member 43. The driving signal is used to indicate a movement amount by the movement mechanism 44. The movement mechanism 44 determines a movement amount on the basis of the driving signal. In addition, the movement amount indicates an amount in which the condensing lens support member 8 is moved by the movement mechanism 44, and may be related to either movement in the horizontal direction or movement in the vertical direction.

(Actuator 42 and Connection Member 43)

The actuator 42 includes a driving mechanism of which a position is displaced by an electromagnetic force, and is connected to the condensing lens support member 8 via the connection member 43. The actuator 42 can move the condensing lens support member 8 by using the connection member 43. In other words, as described above, the actuator 42 and the connection member 43 constitute the movement mechanism 44 which moves the condensing lens support member 8.

The actuator 42 determines a movement amount of the condensing lens support member 8 on the basis of the driving signal from the actuator driving circuit 41, and moves the condensing lens support member 8 according to the movement amount.

The condensing lens 4 is also moved due to the movement of the condensing lens support member 8. In other words, a focal position of the condensing lens 4 is also displaced. An irradiation area of laser light applied to the light emitting portion 3 can be changed by changing the focal position of the condensing lens 4.

In addition, the condensing lens 27 is moved so as to be focused on the metal base 6, but the condensing lens 4 is required to be defocused on the light emitting portion 3. In other words, a position of the condensing lens 27 is required to be set so that the condensing lens 27 is focused on the metal base 6 at a position of the condensing lens 4 in a case where the condensing lens 4 is defocused on the light emitting portion 3 and a desired irradiation area is obtained.

Here, although an electromagnetic force is used as means for the movement of the actuator 42, the present invention is not limited thereto. Means may be used which moves at a speed for producing a desired irradiation area of laser light applied to the light emitting portion 3 by moving the condensing lens support member 8 supporting the condensing lens 4 when the positional deviation detection unit 20 detects positional deviation. For example, other means may include a motor.

(Operation Principle of Light Emitting Device 101)

Laser light emitted from the laser element 2 is incident on the condensing lens 4 through the opening 8a provided in the condensing lens support member 8. When the laser light passes through the condensing lens 4, the laser light is shaped so as to have a desired beam shape at the light emitting portion 3. After passing through the condensing lens 4, the laser light passes through the window 9a which is provided in the reflection mirror 9 and transmits the laser light therethrough or allows the laser light to pass therethrough, and is applied to the light emitting portion 3. The light emitting portion 3 is disposed on the heat dissipation plate 7, and the heat dissipation plate 7 is provided in the metal base 6.

When the laser light is applied to the light emitting portion, fluorescence is radiated from the light emitting portion 3. However, some of the laser light is reflected or scattered by the light emitting portion 3. In addition, of the laser light applied to the light emitting portion 3, some laser light which is not converted into fluorescence is converted into heat, and some of the generated heat is conducted sequentially to the heat dissipation plate 7 and the metal base 6. Accordingly, heat is dissipated from the light emitting portion 3.

In addition, the laser light applied to the light emitting portion 3 is converted into fluorescence by the light emitting portion 3 or is reflected or scattered at the light emitting portion 3, but these light beams are mixed, thereby finally obtaining desired illumination light.

(Positional Deviation Adjustment Method)

Figure 2:
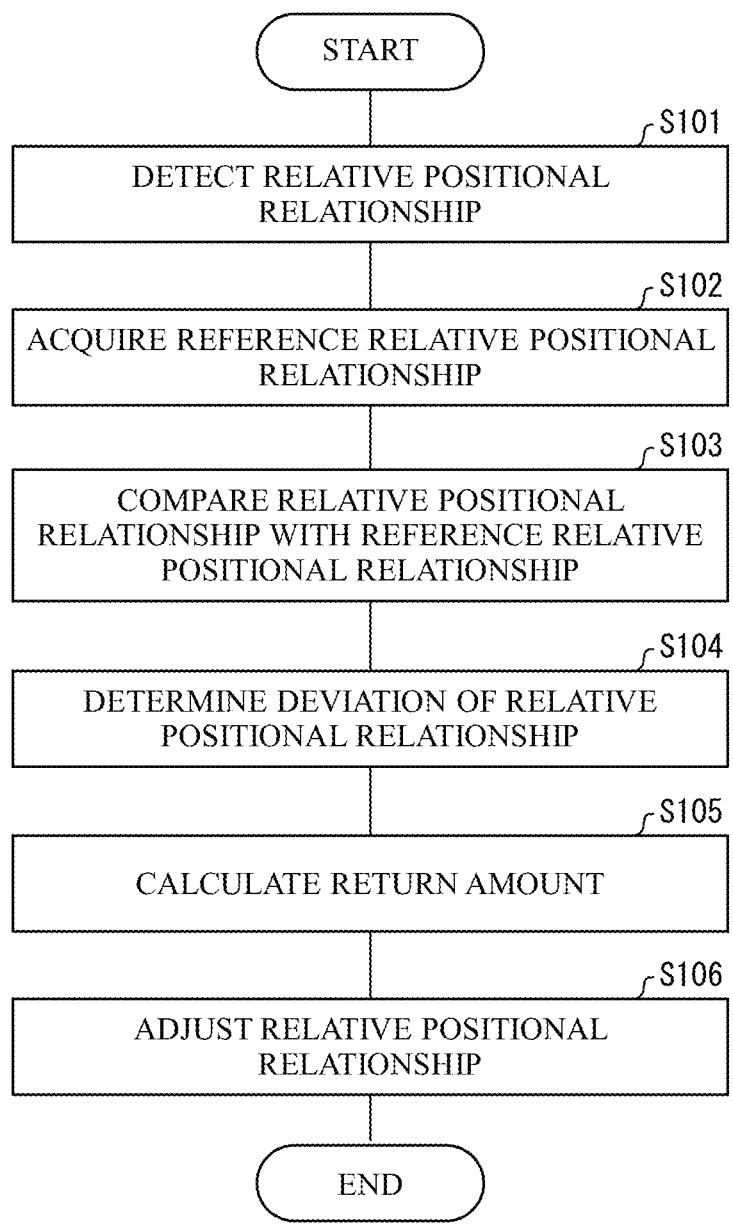
FIG. 2 is a flowchart illustrating processing procedures of a positional deviation adjustment method according to an embodiment of the present invention.

FIG. 2 is a flowchart illustrating processing procedures of a positional deviation adjustment method performed by the positional deviation detection unit 20 and the positional deviation adjustment unit 40.

As illustrated in FIG. 2, first, the detection portion 21 of the positional deviation detection unit 20 detects a relative positional relationship between the laser element 2, the condensing lens 4, and the light emitting portion 3 (step S101: a detection step).

Next, when a detection result is received from the detection portion 21, the determination portion 22 of the positional deviation detection unit 20 acquires reference relative positional relationship information indicating a reference relative positional relationship from the storage portion 23 (step S102).

Next, the determination portion 22 compares a relative positional relationship between the laser element 2, the condensing lens 4, and the light emitting portion 3, which is the detection result from the detection portion 21, with the reference relative positional relationship indicated by the reference relative positional relationship information acquired from the storage portion 23 (step S103). In addition, the determination portion 22 determines from the comparison result whether or not the relative positional relationship between the laser element 2, the condensing lens 4, and the light emitting portion 3 is deviated from the reference relative positional relationship (step S104: a determination step).

Next, when the determination result is received from the determination portion 22, the actuator driving circuit 41 of the positional deviation adjustment unit 40 extracts a specific deviation amount included in the determination result. In addition, the actuator driving circuit 41 calculates an adjustment amount (return amount) necessary to return the relative positional relationship detected by the detection portion 21 to the reference relative positional relationship by the use of the deviation amount (step S105). In step S105, the actuator driving circuit 41 outputs a driving signal indicating the adjustment amount to the actuator 42.

Next, the actuator 42 of the positional deviation adjustment unit 40 moves the connection member 43 on the basis of the driving signal from the actuator driving circuit 41. Due to the movement, the condensing lens support member 8 is moved, and thus the relative positional relationship between the laser element 2, the condensing lens 4, and the light emitting portion 3 is returned to the reference relative positional relationship, thereby adjusting the relative positional relationship (step S106: a positional deviation adjustment step).

In this way, the positional deviation adjustment method by the positional deviation detection unit 20 and the positional deviation adjustment unit 40 is finished.

(Effects of Light Emitting Device 101)

Since a laser light irradiation area in the light emitting portion 3 can be made constant, and thus an intensity of fluorescence from the light emitting portion 3 does not vary over time, it is possible to prevent flickering of illumination light. Therefore, it is possible not to make a person's eyes tired.

[Embodiment 2]

Figure 3:
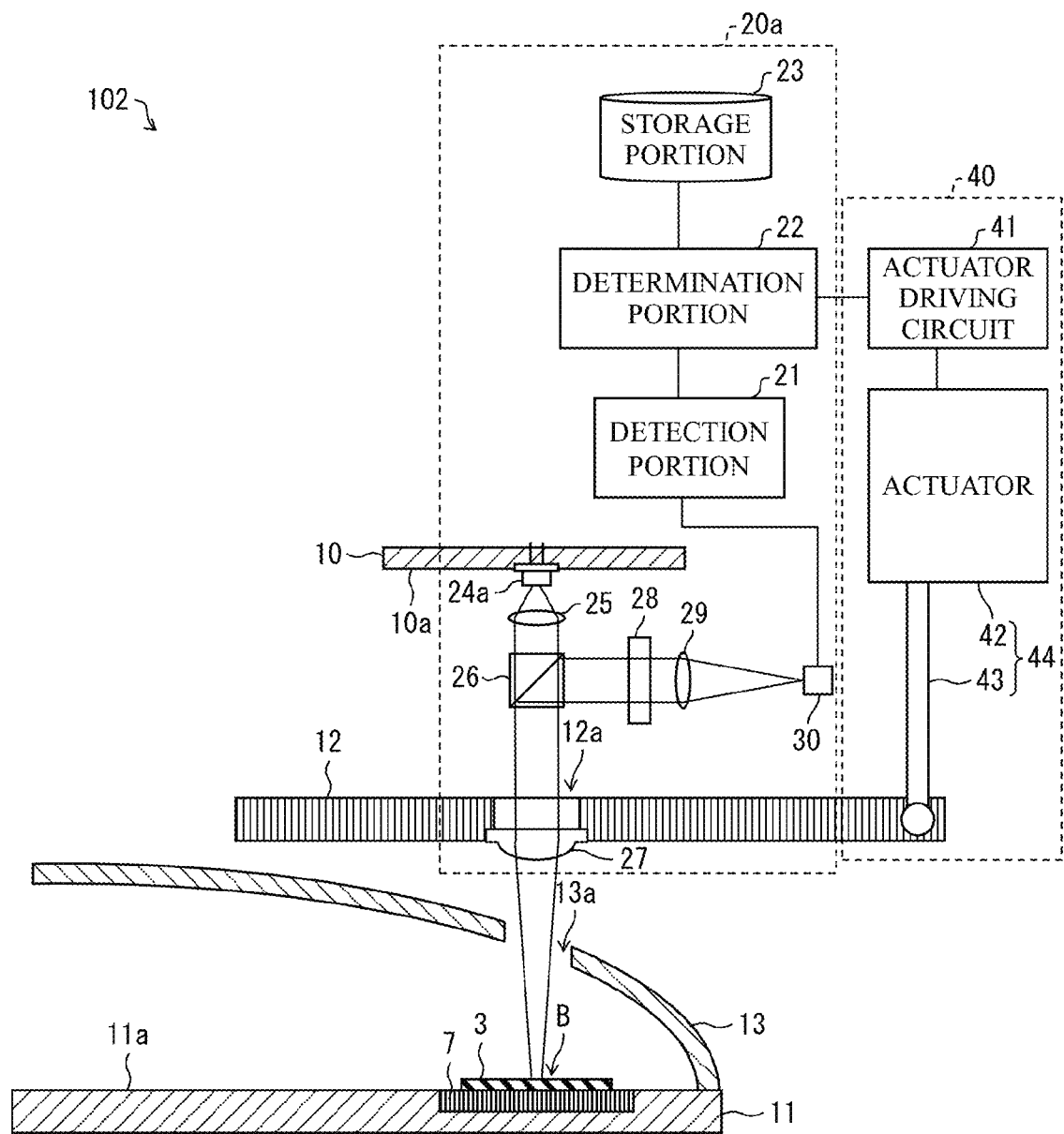
FIG. 3 is a diagram illustrating a configuration of a light emitting device according to another embodiment of the present invention.

Another embodiment of the present invention will be described with reference to FIG. 3. FIG. 3 is a cross-sectional view illustrating a schematic configuration of a light emitting device 102 according to Embodiment 2 of the present invention. In addition, the same members as in Embodiment 1 are given the same reference numeral, and description thereof will be omitted.

The light emitting device 102 includes, as illustrated in FIG. 3, a light emitting portion 3, a heat dissipation plate 7, a laser element support member 10, a metal base 11, a condensing lens support member 12, a reflection mirror 13, a positional deviation detection unit 20a, and a positional deviation adjustment unit 40.

A difference between the light emitting device 102 and the light emitting device 101 is that a single laser element 24a combines the laser element 2 and the laser element 24 of the light emitting device 101 together. In addition, the laser element support member 10 differs from the laser element support member 5 in that it supports only a single laser element 24a. The metal base 11 is different from the metal base 6 in that laser light is not applied to a light emitting portion support surface 11a of the metal base 11. The condensing lens support member 12 differs from the condensing lens support member 8 in that it supports only a single condensing lens 27. The reflection mirror 13 differs from the reflection mirror 9 in that it has only a single window 13a which transmits laser light from a single laser element 24a therethrough or allows the laser light to pass therethrough.

The light emitting device 102 is a mechanism in which a single laser element 24a combines a laser element emitting laser light which contributes to emission of the light emitting portion 3 with a laser element emitting laser light which is used by the positional deviation detection unit 20a, and the positional deviation detection unit 20a uses laser light which does not contribute to emission of the light emitting portion 3 but is reflected from the light emitting portion 3.

After laser light emitted from 24a is shaped so as to have a desired shape by the collimator lens 25, the laser light is transmitted through the beam splitter 26 so as to be incident on the condensing lens 27 through an opening 12a provided in the condensing lens support member 12.

The laser light from the laser element 24a which is incident on the condensing lens 27 is applied to the light emitting portion 3. The laser light, which is reflected from the light emitting portion 3 without contributing to emission of the light emitting portion 3, is incident on the condensing lens 27 so as to be reflected by the beam splitter 26, and is then incident on the fluorescence cutoff filter 28.

The laser light which has been transmitted through the fluorescence cutoff filter 28 is incident on the lens 29 so as to be given astigmatism by the lens 29, and forms a light spot on the light receiving element 30. The light receiving element 30 receives a light spot applied to each of four light receiving surfaces.

Here, since the light emitting device 102 has an aim of maintaining an irradiation area on the light emitting portion 3 in a desired irradiation area without focus, an intensity distribution of a light spot applied to each of the four light receiving surfaces of the light receiving element 30 is required to set an intensity distribution indicating a defocused position as a reference position. Such a reference position is set in advance, and thus it is possible to perform control for returning to the reference position.

(Effects of Light Emitting Device 102)

In the present embodiment, it is not necessary to prepare for two laser elements, and thus it is possible to decrease the number of manufacturing steps, costs thereof, and a size of the entire device.

[Embodiment 3]

Figure 4:
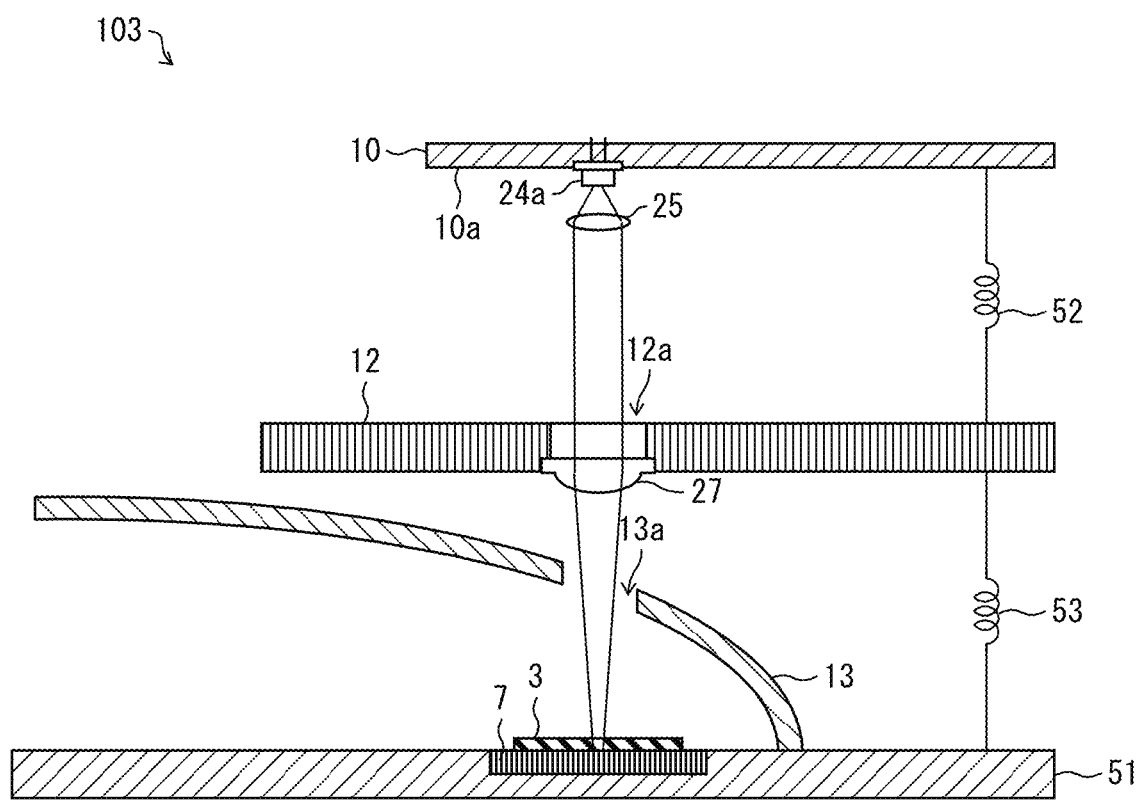
FIG. 4 is a diagram illustrating a configuration of a light emitting device according to still another embodiment of the present invention.

Still another embodiment of the present invention will be described with reference to FIG. 4. FIG. 4 is a cross-sectional view illustrating a schematic configuration of a light emitting device 103 according to Embodiment 3 of the present invention. The light emitting device 103 is different from the light emitting device 101 or the light emitting device 102 in that an elastic member 52 and an elastic member 53 such as a spring is used instead of the positional deviation detection unit 20 and the positional deviation adjustment unit 40 or the positional deviation detection unit 20a and the positional deviation adjustment unit 40 of Embodiment 2.

In the light emitting device 103, the elastic member 52 is connected between the laser element support member 10 and the condensing lens support member 12, and the elastic member 53 is connected between the condensing lens support member 12 and a metal base 51.

The elastic member 52 maintains a relative positional relationship between the laser element support member 10 and the condensing lens support member 12 to be constant. Similarly, the elastic member 53 maintains a relative positional relationship between the condensing lens support member 12 and the metal base 51 to be constant.

For this reason, the laser light irradiation area on the light emitting portion 3 can be made to be constant with a simpler configuration than in Embodiment 1 or Embodiment 2.

[Embodiment 4]

Figure 5:
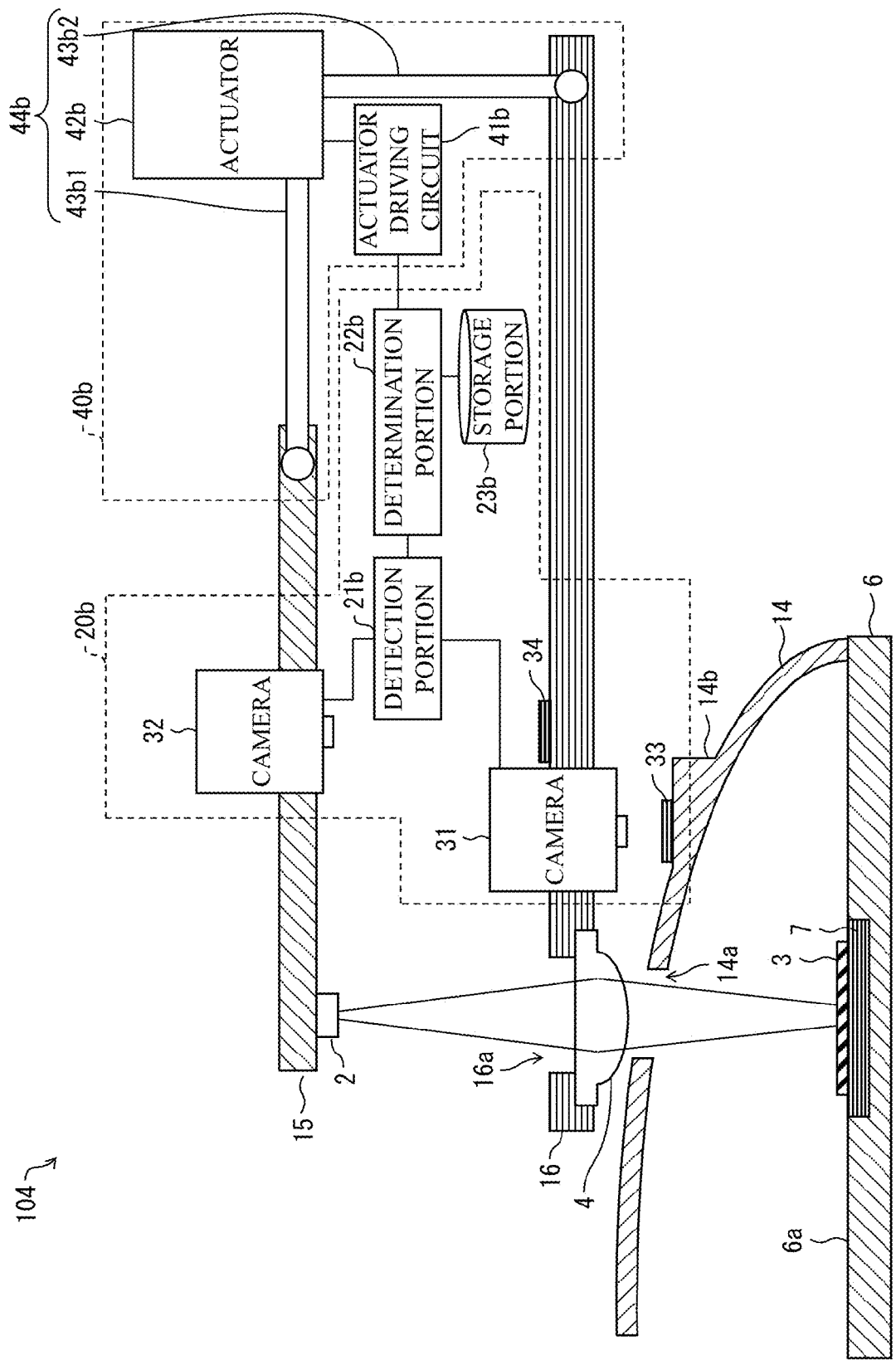
FIG. 5 is a diagram illustrating a configuration of a light emitting device according to still another embodiment of the present invention.

Still another embodiment of the present invention will be described with reference to FIG. 5. FIG. 5 is a cross-sectional view illustrating a schematic configuration of a light emitting device 104 according to Embodiment 4 of the present invention. In addition, the same members as in Embodiments 1 to 3 are given the same reference numeral, and description thereof will be omitted.

As illustrated in FIG. 5, the light emitting device 104 includes a laser element 2, a light emitting portion 3, a condensing lens 4, a laser element support member 15, a metal base 6, a heat dissipation plate 7, a condensing lens support member 16, a reflection mirror 14, a positional deviation detection unit 20b, and a positional deviation adjustment unit 40b.

The positional deviation detection unit 20b includes a detection portion 21b, a determination portion 22b, a storage portion 23b, a camera 31, a camera 32, a marker 33, and a marker 34.

The camera 31 is supported by the condensing lens support member 16. Specifically, the camera 31 is fitted in the condensing lens support member 16, and captures an image of the marker 33 which is disposed on a marker fixing portion 14b of the reflection mirror 14.

The camera 31 may use, for example, a CCD camera. The CCD camera may have a passive type automatic focus function which is used to adjust focus of a digital camera or the like.

As described above, the marker 33 is disposed on the marker fixing portion 14b of the reflection mirror 14. The marker 33 is further included in an imaging region of the camera 31. Here, the reflection mirror 14 and the metal base 6 are fixed in advance so that positions thereof deviate from each other. For example, the reflection mirror 14 may be integrated with the metal base 6, or both of the two may be fixed to the other same member. Accordingly, a relative positional relationship between the marker 33 and the light emitting portion 3 is fixed.

The camera 31 captures an image of the marker 33, and outputs the imaging result to the detection portion 21b. The detection portion 21b detects a relative positional relationship between the camera 31 and the marker 33 by using the imaging result output from the camera 31.

As described above, a relative positional relationship between the marker 33 and the light emitting portion 3 is fixed. Therefore, the relative positional relationship between the camera 31 and the light emitting portion 3 can be derived from the relative positional relationship between the camera 31 and the marker 33. On the other hand, the camera 31 is fixed to the condensing lens support member 16, and thus a relative positional relationship between the camera 31 and the condensing lens 4 is also fixed. The relative positional relationship between the condensing lens 4 and the marker 33 can be derived from the relative positional relationship between the camera 31 and the marker 33.

In other words, the detection portion 21b can derive a relative positional relationship between the condensing lens 4 and the light emitting portion 3 from these facts by using an imaging result from the camera 31.

The camera 32 is supported by the laser element support member 15. Specifically, the camera 32 is fitted in the laser element support member 15, and captures an image of the marker 34 disposed on the condensing lens support member 16.

The camera 32 may use, for example, a CCD camera, in the same manner as the camera 31. The CCD camera may have a passive type automatic focus function which is used to adjust focus of a digital camera or the like.

As described above, the marker 34 is disposed on the condensing lens support member 16. The marker 34 is further included in an imaging region of the camera 32. Here, the condensing lens 4 is fitted in the condensing lens support member 16. Accordingly, a relative positional relationship between the marker 34 and the condensing lens support member 16 is fixed.

The camera 32 captures an image of the marker 34, and outputs the imaging result to the detection portion 21b. The detection portion 21b detects a relative positional relationship between the camera 32 and the marker 34 by using the imaging result output from the camera 32.

A relative positional relationship between the marker 34 and the condensing lens 4 is fixed. Therefore, the relative positional relationship between the camera 32 and the condensing lens 4 can be derived from the relative positional relationship between the camera 32 and the marker 34. On the other hand, the camera 32 is fixed to the laser element support member 15, and thus a relative positional relationship between the camera 32 and the laser element 2 is also fixed. The relative positional relationship between the laser element 2 and the marker 34 can be derived from the relative positional relationship between the camera 32 and the marker 34.

In other words, the detection portion 21b can derive a relative positional relationship between the laser element 2 and the condensing lens 4 from these facts by using an imaging result from the camera 32.

Figure 6:
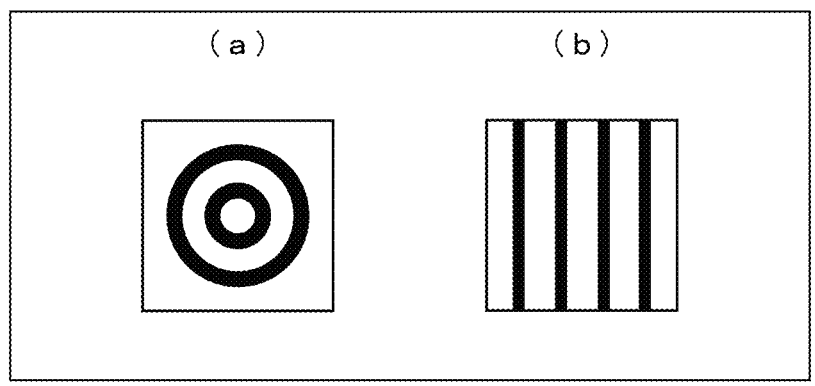
FIG. 6 is a schematic diagram illustrating a specific example of a marker.

FIGS. 6(a) and 6(b) illustrate an example of the marker 33 and the marker 34, respectively. The camera 31 and the camera 32 image white parts and black parts drawn in the marker 33 and the marker 34, and output an intensity distribution of contrast between the two parts to the detection portion 21b.

The detection portion 21b detects a relative positional relationship between the laser element 2, the condensing lens 4, and the light emitting portion 3 of the light emitting device 104. The detection portion 21b is connected to the camera 31 and the camera 32, and receives an imaging result from the camera 31 and an imaging result from the camera 32 as described above. The detection portion 21b detects a relative positional relationship between the laser element 2, the condensing lens 4, and the light emitting portion 3 on the basis of the imaging results. Specifically, the detection portion 21 detects the relative positional relationship between the laser element 2, the condensing lens 4, and the light emitting portion 3 so that laser light emitted from the laser element 2 is applied to the light emitting portion 3 with a desired irradiation area.

The determination portion 22b compares the detection result from the detection portion 21b with a reference relative positional relationship between the laser element 2, the condensing lens 4, and the light emitting portion 3, and determines whether or not the relative positional relationship between the laser element 2, the condensing lens 4, and the light emitting portion 3 is deviated from the reference relative positional relationship.

The positional deviation adjustment unit 40b includes an actuator driving circuit 41b, an actuator 42b, a connection member 43b1, and a connection member 43b2.

The actuator driving circuit 41b extracts a deviation amount included in the determination result from the determination portion 22b. The actuator driving circuit 41b generates, from the deviation amount, a driving signal for performing movement using a movement mechanism 44b constituted by the actuator 42b, the connection member 43b1, and the connection member 43b2. Here, the connection member 43b1 connects the actuator 42b to the laser element support member 15, and the connection member 43b2 connects the actuator 42b to the condensing lens support member 16. Therefore, the driving signal is a signal indicating a movement amount by the movement mechanism 44b, that is, a movement amount of each of the laser element support member 15 and the condensing lens support member 16. In addition, the movement amount may be related to either movement in the horizontal direction or movement in the vertical direction.

In addition, in the present embodiment, the positional deviation detection unit 20b detects a deviation of the relative positional relationship between the laser element 2, the condensing lens 4, and the light emitting portion 3 from the reference relative positional relationship, and then, the positional deviation adjustment unit 40b returns the relative positional relationship between the laser element 2, the condensing lens 4, and the light emitting portion 3, to the reference relative positional relationship, using the detection result from the positional deviation detection unit 20b.

Here, the positional deviation adjustment unit 40b is not required to return a relative positional relationship between the laser element 2, the condensing lens 4, and the light emitting portion 3 to a reference relative positional relationship through only a single return operation. For example, a relative positional relationship may gradually move toward a reference relative positional relationship through a plurality of return operations. In addition, a plurality of return operations may be performed until the positional deviation detection unit 20b does not detect positional deviation. In this case, the positional deviation detection unit 20b detects positional deviation each time the positional deviation adjustment unit 40b performs a return operation.

This form is a form performed in the same manner as, for example, a passive type automatic focus function used for focusing a digital camera, that is, focusing the camera in which the camera is actually moved and stops being moved when focused.

[Embodiment 5]

Embodiment 5 of the present invention is a form in which Embodiment 1 related to a reflective light emitting device is applied to a transmissive light emitting device. Hereinafter, differences from Embodiment 1 will be described.

Figure 7:
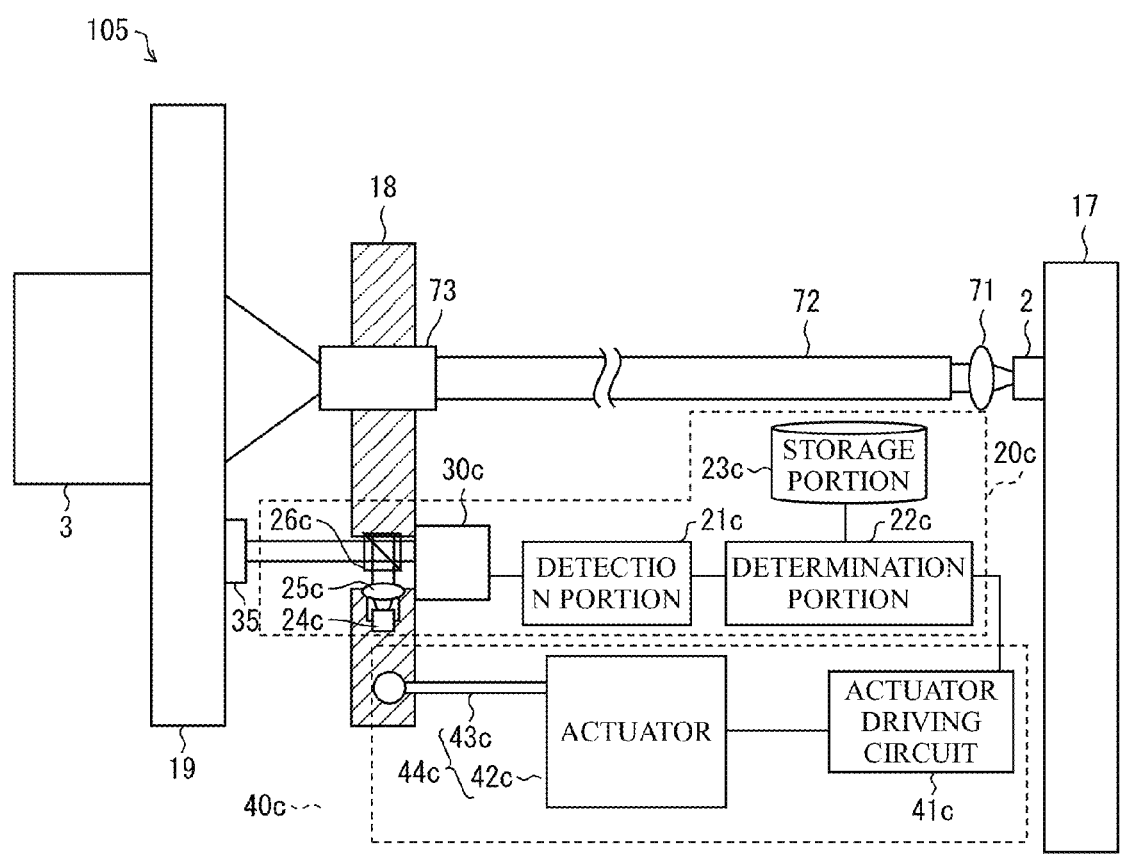
FIG. 7 is a diagram illustrating a configuration of a light emitting device according to still another embodiment of the present invention.

Embodiment 5 of the present invention will be described with reference to FIG. 7. FIG. 7 is a cross-sectional view illustrating a schematic configuration of a light emitting device 105 according to Embodiment 5 of the present invention. In addition, the same members as in Embodiments 1 to 4 are given the same reference numeral, and description thereof will be omitted.

As illustrated in FIG. 7, the light emitting device 105 includes a laser element 2, a condensing lens 71, an optical fiber 72, a ferrule (optical member) 73, a light emitting portion 3, a laser element support member 17, a ferrule support member 18, a light emitting portion support member 19, a positional deviation detection unit 20c, and a positional deviation adjustment unit 40c.

The optical fiber 72 is a light guiding member which guides laser light oscillated by the laser element 2 to the light emitting portion 3, and is a bundle of a plurality of optical fibers. For example, laser light is incident on the optical fiber 72 from the laser element 2, for example, via the condensing lens 71. A front end of the optical fiber 72 is supported by the ferrule 73, and is supported by the ferrule support member 18.

The light emitting portion 3 is supported by the light emitting portion support member 19 using a transmissive member which transmits laser light therethrough. The laser light emitted from the front end of the optical fiber 72 is transmitted through the light emitting portion support member 19 and is applied to the light emitting portion 3.

The positional deviation detection unit 20c includes a detection portion 21c, a determination portion 22c, a storage portion 23c, a laser element 24c, a collimator lens 25c, a beam splitter (half mirror) 26c, a light receiving element 30c, and a reflective member 35. Laser light emitted from the laser element 24c passes through the collimator lens 25c and is incident on the beam splitter 26c. The laser light emitted from the beam splitter 26c travels toward the reflective member 35 so as to be reflected by the reflective member 35, and then passes through the beam splitter 26c so as to be applied to the light receiving element 30c.

The laser element 24c is fitted in the ferrule support member 18, and, on the other hand, the reflective member 35 is fixed to the light emitting portion support member 19. The positional deviation detection unit 20c detects a relative positional relationship between the laser element 24c and the reflective member 35 so as to detect a relative positional relationship between the ferrule 73 supported by the ferrule support member 18, that is, the front end of the optical fiber 72 and the light emitting portion 3 supported by the light emitting portion support member 19.

[Embodiment 6]

Embodiment 6 of the present invention is a form in which Embodiment 4 related to a reflective light emitting device is applied to a transmissive light emitting device. Hereinafter, differences from Embodiment 4 will be described.

Figure 8:
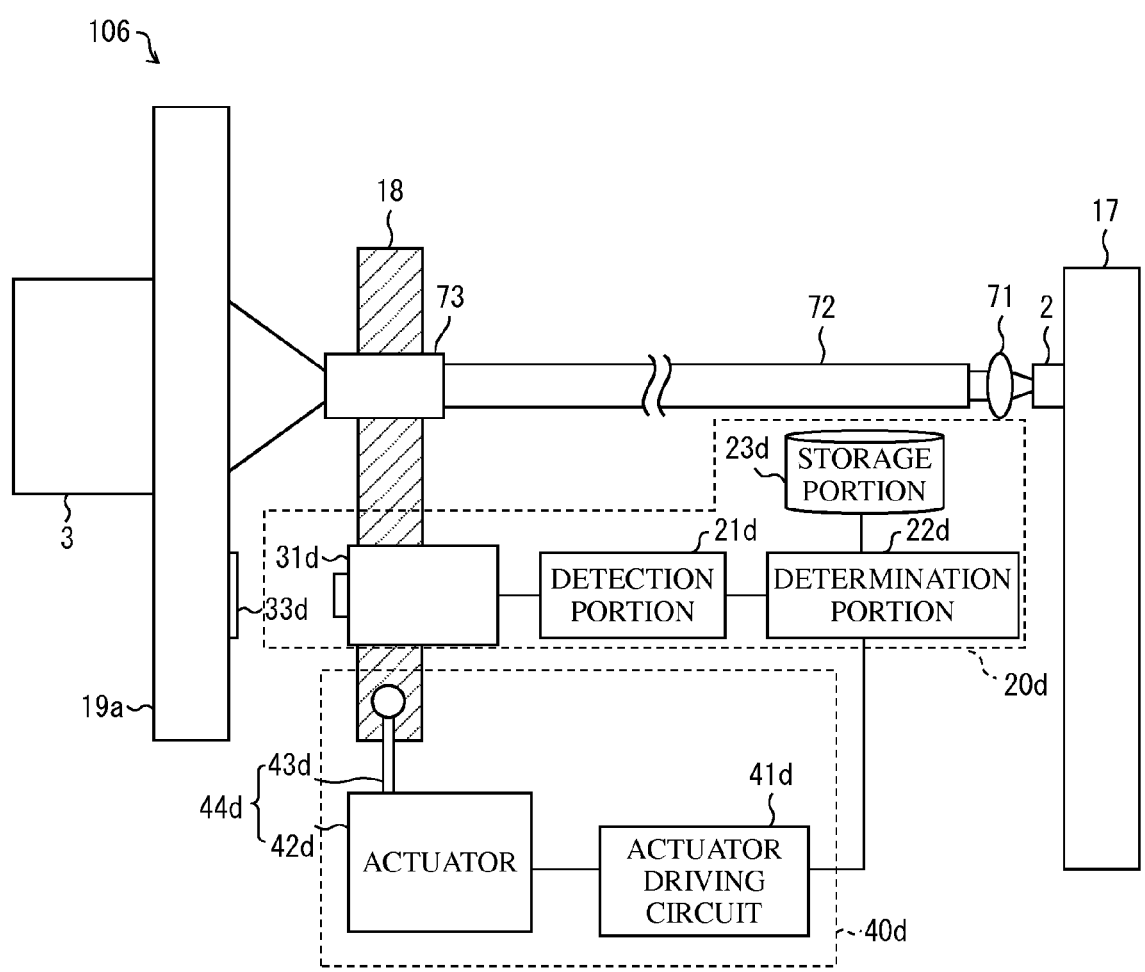
FIG. 8 is a diagram illustrating a configuration of a light emitting device according to still another embodiment of the present invention.

Embodiment 6 of the present invention will be described with reference to FIG. 8. FIG. 8 is a cross-sectional view illustrating a schematic configuration of a light emitting device 106 according to Embodiment 6 of the present invention. In addition, the same members as in Embodiments 1 to 5 are given the same reference numeral, and description thereof will be omitted.

As illustrated in FIG. 8, the light emitting device 106 includes a laser element 2, a condensing lens 71, an optical fiber 72, a ferrule 73, a light emitting portion 3, a laser element support member 17, a ferrule support member 18, a light emitting portion support member 19a, a positional deviation detection unit 20d, and a positional deviation adjustment unit 40d.

The positional deviation detection unit 20d includes a detection portion 21d, a determination portion 22d, a storage portion 23d, a camera 31d, and a marker 33d.

The camera 31d is fitted in the ferrule support member 18, and, on the other hand, the marker 33d is fixed to the light emitting portion support member 19a. The positional deviation detection unit 20d detects a relative positional relationship between the camera 31d and the marker 33d so as to detect a relative positional relationship between the ferrule 73 supported by the ferrule support member 18, that is, the front end of the optical fiber 72 and the light emitting portion 3 supported by the light emitting portion support member 19a.

In Embodiments 1 to 6 described above, the light emitting device having the positional deviation detection unit and the positional deviation adjustment unit has been described, but the positional deviation detection unit and the positional deviation adjustment unit may be independent of the light emitting device. In this case, each of the positional deviation detection unit and the positional deviation adjustment unit may have a form of being attachable to and detachable from the light emitting device.

Definition of Condensing in the Present Invention

In Embodiments 1 to 6 described above, for example, as illustrated in FIG. 1, laser light emitted from the laser element 2 passes through the condensing lens 4, and thus converges toward the light emitting portion 3 so as to be applied to the light emitting portion 3. In other words, the condensing lens 4 makes light emitted from the laser element 2 converge toward the light emitting portion 3. Therefore, in Embodiments 1 to 6 described above, "condensing" of the condensing lens 4 can be said to have a meaning in which "light is narrowed", in other words, "light is collected at one point".

However, the meaning of "condensing" in the present invention is not limited to "narrowing of light" or "collecting of light at one point". The meaning of "condensing" in the present invention is, in summary, that "light is applied to a desired irradiation region", and thus includes not only the meaning that "light is narrowed" or "light is collected at one point" but also the meaning that "light is widened", more specifically, the meaning that "light is widened from one point" or the meaning that "a traveling direction of light is not changed". Hereinafter, the latter meaning will be described using a specific example.

Figure 9:
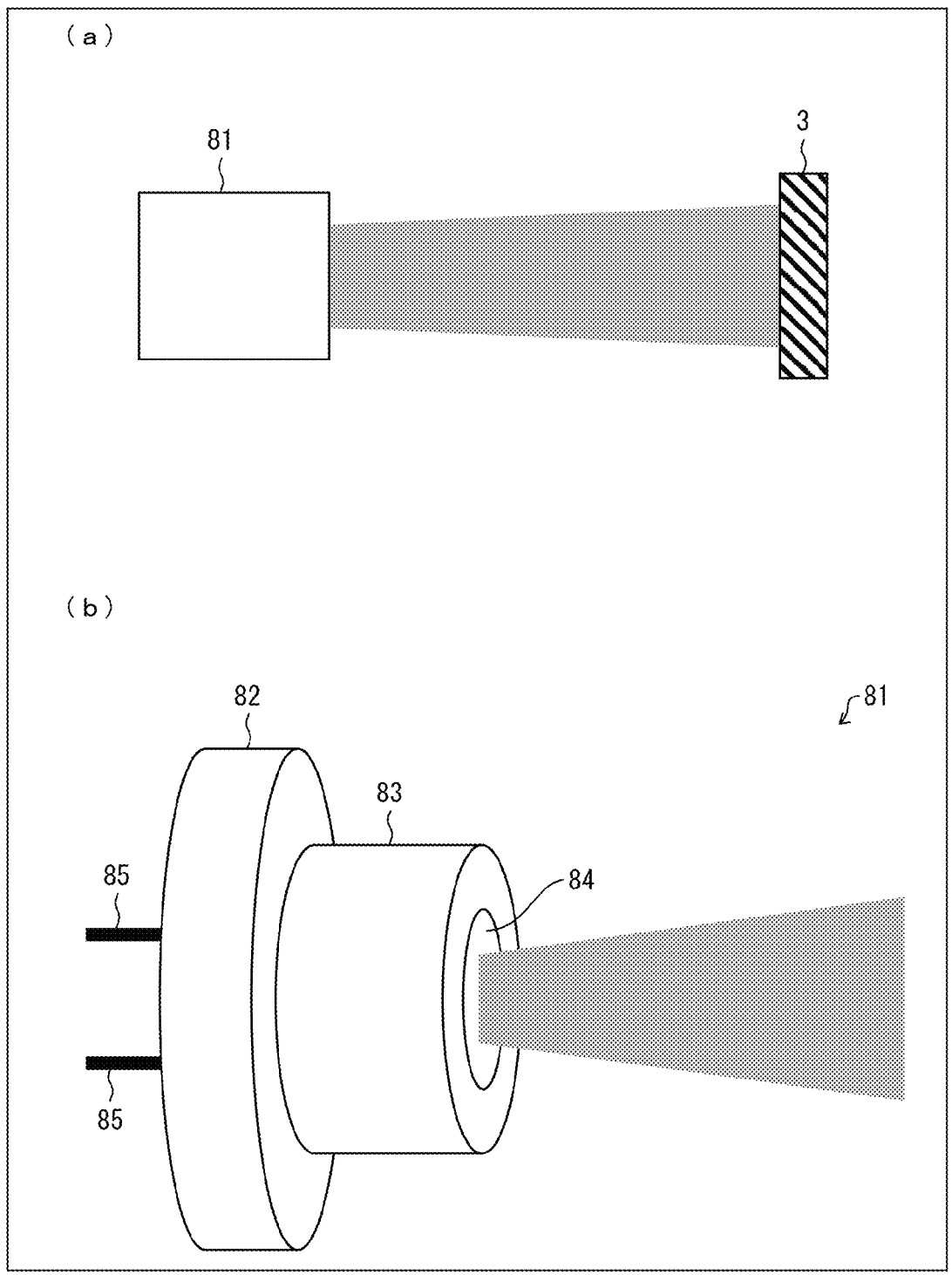
Figure 10:
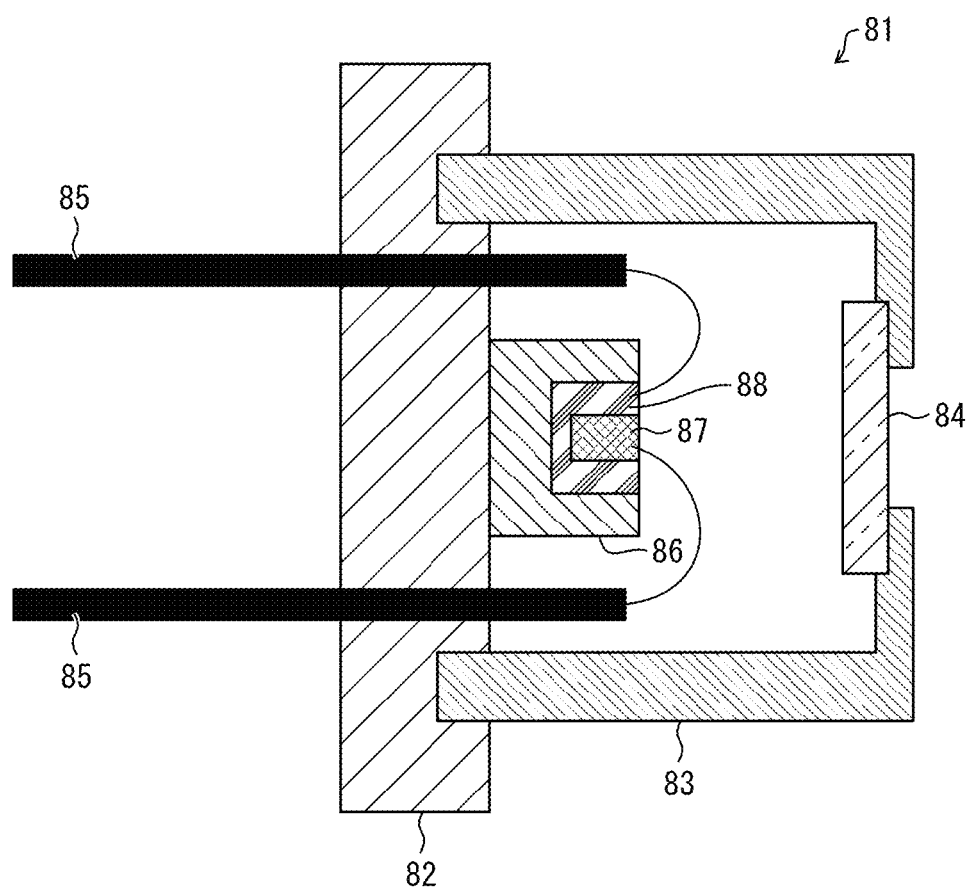
FIG. 10 is a cross-sectional view of the semiconductor laser unit.

For example, FIG. 9 illustrates a semiconductor laser unit suitable for the present invention. FIG. 9(a) is a diagram illustrating a positional relationship between a semiconductor laser unit 81 and a light emitting portion 3, and FIG. 9(b)

is an exterior of the semiconductor laser unit 81. In addition, FIG. 10 is a cross-sectional view of the semiconductor laser unit 81 of FIG. 9(*b*).

As illustrated in FIG. 9(*a*), the semiconductor laser unit 81 emits laser light toward the light emitting portion 3, and the laser light is applied to the light emitting portion 3. As illustrated in FIG. 9(*b*), the semiconductor laser unit 81 includes a cap glass 84 on the laser light emitting direction side, and thus emits laser light to outside of the semiconductor laser unit 81 through the cap glass 84.

As illustrated in FIGS. 9(*b*) and 10, in the semiconductor laser unit 81, a semiconductor laser element 87 is sealed in a package constituted by a stem 82 and a cap 83. The above-described cap glass 84 is fused to an opening of the cap 83, and the cap glass 84 has a function of extracting laser light emitted from the semiconductor laser element 87 to outside of the cap 83. In addition, the semiconductor laser element 87 is sealed to be airtight in the package by the cap glass 84 and the cap 83.

The semiconductor laser element 87 is embedded and loaded in a laser element holding member 86 disposed on the stem 82 along with a heat sink 88 described later. The laser element holding member 86 is fixed onto the stem 82, and maintains a description between the semiconductor laser element 87 and the cap glass 84 to be constant. Accordingly, laser light emitted from the semiconductor laser element 87 is reliably incident on the cap glass 84.

The semiconductor laser element 87 is surrounded by the heat sink 88 using a high heat conducting material such as metal, except for on the laser light emitting surface side thereof. Heat generated by the semiconductor laser element 87 is efficiently dissipated toward the laser element holding member 86 side via the heat sink 88.

Two leads 85 are installed in the stem 82, and a driving current for driving the semiconductor laser element 87 is supplied using the two leads 85 from outside of the semiconductor laser unit 81. In addition, as illustrated in FIG. 10, the two leads 85 are respectively electrically connected to two electrodes of the semiconductor laser element 87 loaded in the laser element holding member 86, via wirings, the laser element holding member 86, and the heat sink 88.

In the semiconductor laser unit 81, the cap glass 84 is an example of an "optical member" of the present invention, and the semiconductor laser element 87 is an example of an "excitation light source". In this case, laser light emitted from the semiconductor laser element 87 can be said to be collected by the cap glass 84 and be applied to the light emitting portion 3.

The laser light emitted from the semiconductor laser element 87 is incident on the cap glass 84 with a spread angle depending on an alignment characteristic of the semiconductor laser element 87. The cap glass 84 emits the laser light incident thereto almost without widening the laser light.

More specifically, when incident on the cap glass 84, the laser light emitted from the semiconductor laser element 87 changes its spread angle according to respective refractive indexes of the cap glass 84 and the ambient gas (for example, dry air sealed in the cap 83) in an interface of the cap glass 84. The laser light travels while maintaining its spread angle inside the cap glass 84.

The laser light travels through the cap glass 84, and, when emitted from the cap glass 84, the laser light changes its spread angle again according to respective refractive indexes of the cap glass 84 and the ambient gas in an interface of the cap glass 84.

In the semiconductor laser unit 81, the laser light, which is emitted from the semiconductor laser element 87 and then changes its spread angle twice, is applied to the light emitting portion 3 as illustrated in FIG. 9.

In other words, the meaning of "condensing" here is not that "light is narrowed" or "light is collected at one point" unlike in cases of Embodiments 1 to 6 described above. The meaning thereof is that "light is widened", "light is widened from one point", and "a traveling direction of light is not changed".

In this way, the meaning of "condensing" in the present invention can be said to be "to allow light to be applied to a desired irradiation region".

[Other Configuration Examples of Light Emitting Device]

The light emitting device of the present invention may be applied to a vehicle headlamp or other illumination apparatuses. An example of the illumination apparatus of the present invention may include a downlight. The downlight is an illumination apparatus which is installed on a ceiling of a structure such as a house or a vehicle. In addition, the illumination apparatus of the present invention may be implemented as a headlamp of a vehicle or other moving objects (for example, human beings, ships, aircrafts, submersible vessels, rockets, and the like), or may be implemented as a searchlight, a projector, or an indoor luminaire (a stand lamp or the like) other than the downlight. Particularly, in a case where a projector is used in a vibrating environment (for example, a moving object such as a car), the present invention is very effectively applied to a light emitting device which is a light source of the projector.

Since a laser light irradiation area on the light emitting portion can be made to be constant, and thus an intensity of fluorescence from the light emitting portion does not vary over time, it is possible to suppress the occurrence of speckles and to prevent flickering of illumination light when illumination light is applied to an object. Therefore, it is possible not to make a person's eyes tired.

[Embodiment 7]

Hereinafter, an embodiment of the present invention will be described.

(1. Configuration)

An embodiment regarding an illumination apparatus of the present invention will be described with reference to FIGS. 11 and 12.

An illumination apparatus 201 of the present invention can be used in a headlamp which satisfies a light distribution characteristic criterion of, for example, a car headlamp for travel (high-beam). However, the illumination apparatus of the present invention may be implemented as a headlamp which satisfies a light distribution characteristic criterion of a car headlamp for passing another car (low-beam), and a headlamp of a vehicle and moving objects (for example, human beings, ships, aircrafts, submersible vessels, rockets, and the like) other than a car. In addition, other illumination apparatuses may be implemented as, for example, a searchlight, a projector, a home luminaire, a store luminaire, an office luminaire, and an outdoor luminaire.

Figure 11:
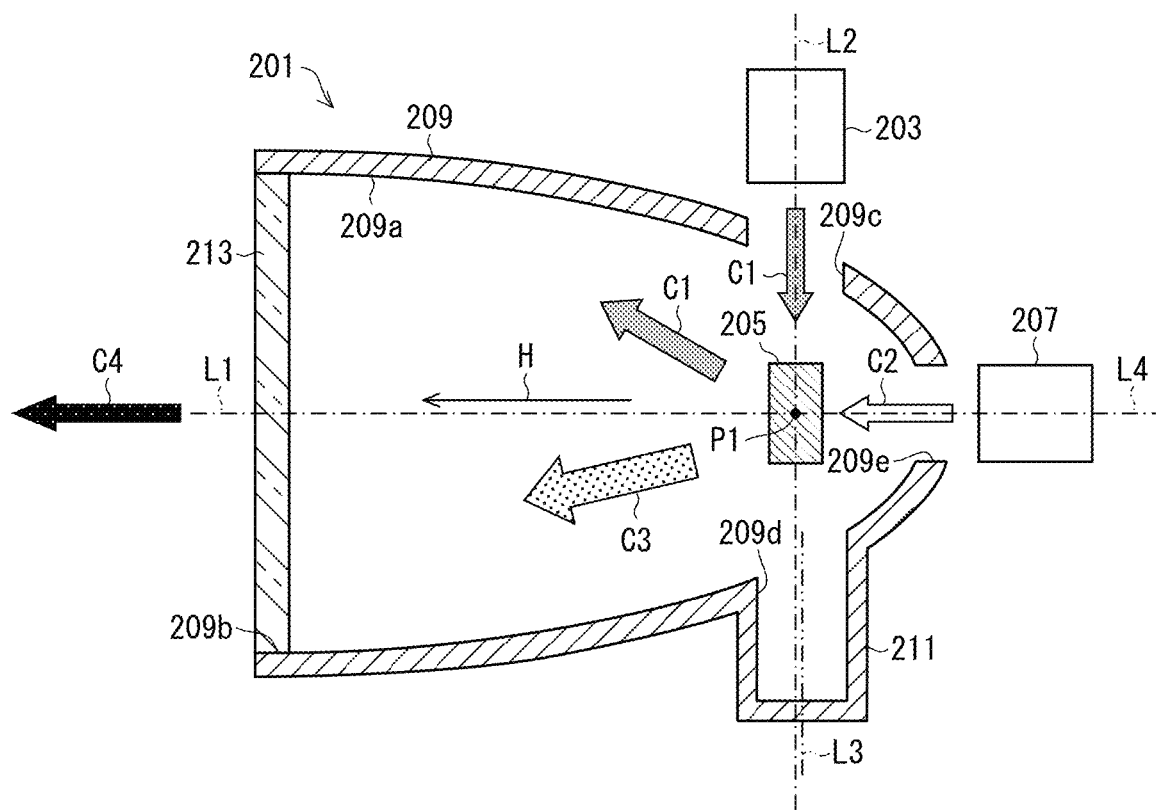
FIG. 11 is a cross-sectional view illustrating a configuration of an illumination apparatus according to an embodiment of the present invention.

The illumination apparatus 201 includes, as illustrated in FIG. 11, an excitation light source 203 which emits excitation light C1, a light emitting portion 205 which receives the excitation light C1 and emits non-excitation light C3, an auxiliary illumination light source 207 which emits auxiliary illumination light C2, a reflector (reflective portion) 209 which applies illumination light C4 formed by the non-excitation light C3 and the auxiliary illumination light C2 in a predetermined illumination direction H, an excitation light termination portion 211 which terminates the excitation light C1 from the excitation light source 203, and an excitation light cutoff filter 213 which prevents the excitation light C1 from leaking to outside of the illumination apparatus 201.

(Reflector 209)

The reflector 209 (a reflective portion) is formed in a parabolic shape which is rotationally symmetric with respect to a central line L1. An inner surface 209a of the reflector 209 is formed of a parabolic reflective surface (hereinafter, referred to as a parabolic reflective surface 209a). One end side of the reflector 209 in the central line L1 direction is open, and forms an illumination light opening 209b through which the illumination light C4 is emitted to outside. In other words, in the reflector 209, the light C2 and C3 from the light emitting portion 205 is reflected by the parabolic reflective surface 209a and is emitted to outside through the opening 209b in the illumination direction H. In addition, the illumination direction H is parallel to the central line L1. A member of the reflector 209 may be, for example, a member in which a metal thin film is formed on a surface thereof, may be a member made of metal, or may be a member having a high reflectance in a wavelength range of the illumination light C4.

(Light Emitting Portion 205)

The light emitting portion 205 is disposed inside (for example, at a focal position) the reflector 209. The light emitting portion 205 is constituted by a phosphor (not illustrated) which is excited by receiving the excitation light C1 from the excitation light source 203 and generates fluorescence (non-excitation light) C3, and a phosphor holding material (not illustrated) which seals the phosphor. The phosphor holding material is preferably an inorganic material.

More specifically, the light emitting portion 205 is formed by dispersing a phosphor in low-melting glass which is a phosphor holding material. A ratio between the low-melting glass and the phosphor is about 10:1. In addition, the light emitting portion 205 may be formed by curing a phosphor in an appropriate treatment, or may be formed, for example, by pressing and fixing a phosphor and performing heat treatment thereon. The phosphor holding material is not limited to low-melting glass, and may be organic-inorganic hybrid glass (HBG), or a silicone resin.

The phosphor is, for example, an oxynitride-based or nitride-based material, in which blue, green and red phosphor are dispersed in low-melting glass. The excitation light source 203 is constituted by, for example, a semiconductor laser, as described later, and oscillates laser light of 405 nm (bluish violet). Thus, when irradiated with the laser light, the light emitting portion 205 emits white light. Therefore, it can be said that the light emitting portion 205 is a wavelength conversion material.

In addition, the semiconductor laser may oscillate laser light (or so-called near blue laser light with a peak wavelength in a wavelength range of 440 nm or greater and 490 nm or less) at 450 nm (blue) as described above, and, in this case, the phosphor is a yellow phosphor, or a mixture of a green phosphor and a red phosphor. The yellow phosphor is a phosphor which generates light with a peak wavelength in a wavelength range of 560 nm or more and 590 nm or less. The green phosphor is a phosphor which generates light with a peak wavelength in a wavelength range of 510 nm or more and 560 nm or less. The red phosphor is a phosphor which generates light with a peak wavelength in a wavelength range of 600 nm or more and 680 nm or less.

Among the above-described phosphor, for example, a phosphor which is commonly called SiAlON may be used as the green phosphor. SiAlON is a substance in which some of silicone atoms of silicon nitride are substituted with aluminum atoms, and some of nitrogen atoms are substituted with oxygen atoms. SiAlON may be formed by dissolving alumina ($Al_2O_3$), silica ($SiO_2$), a rare earth element, and the like in silicon nitride ($Si_3N_4$).

As another preferred example of a phosphor, a semiconductor nanoparticle phosphor using a group III-V compound semiconductor nanoparticle phosphor may be exemplified.

One of features of the semiconductor nanoparticle phosphor is that an emission color can be changed due to a quantum size effect by changing the particle diameter to a nanometer size even if the same compound semiconductor (for example, InP) is used. For example, InP emits red light when the particle size thereof is about 3 nm to 4 nm. Here, the particle size was measured using a transmission type electron microscope (TEM).

In addition, the semiconductor nanoparticle phosphor has a feature in which, since the phosphor is based on a semiconductor, a fluorescence lifetime is short and power of laser light can be quickly radiated as fluorescence, and thus the phosphor has strong resistance to high power laser light. This is because an emission lifetime of the semiconductor nanoparticle phosphor is 10 nanoseconds, which is smaller by five digits than that of a typical phosphor material having a rare earth element as an emission center.

Further, as described above, since the emission lifetime is short, absorption of laser light and emission of the phosphor can be quickly repeated. As a result, high conversion efficiency for strong laser light can be maintained, and thus heat generated from the fluorescent substance can be reduced.

Therefore, it is possible to further suppress the light emitting portion 205 from deteriorating (discoloring or deforming) due to heat. Accordingly, it is possible to increase a lifetime of the light emitting portion 205.

(Excitation Light Source 203)

The excitation light source 203 is constituted by, for example, a semiconductor laser (hereinafter, referred to as a semiconductor laser 203), and emits (oscillates) laser light (hereinafter, referred to as laser light C1) which is the excitation light C1. A wavelength of the excitation light C1 is in a range of, for example, ultraviolet rays or bluish violet light.

As described above, the semiconductor laser 203 functions as an excitation light source which emits the laser light C1. The laser light (excitation light) C1 is oscillated from the semiconductor laser 203. Of course, the semiconductor laser 203 may be provided in a plurality. In this case, the laser light C1 is oscillated from each of a plurality of semiconductor lasers 203.

The laser light C1 emitted from the semiconductor laser 203 is excitation light for exciting a fluorescent substance which is a constituent element of the light emitting portion 205, and is coherent light. The coherent light is generally light which temporally and spatially has a phase, and a wavelength thereof is a single wavelength.

The semiconductor laser 203 has ten light emitting points (ten stripes) in a single chip, oscillates laser light of 405 nm (bluish violet), has output power of 11.2 W, an operation voltage of 5 V, and a current of 6.4 A, and is mounted in a stem with a diameter of 15 mm. When the semiconductor laser 203 is made to output the laser light C1 at 11.2 W described above, power consumption thereof becomes 32 W (5 V×6.4 A). Of course, the laser light C1 oscillated by the semiconductor laser 203 is not limited to 405 nm, and may be laser light with a peak wavelength in a wavelength range of 400 nm or more and 420 nm or less.

In addition, the laser light C1 emitted from the semiconductor laser 203 may be laser light of 420 nm or more, for example, blue (450 nm) laser light, or laser light with a peak wavelength in a wavelength range of near blue (440 nm or more and 490 nm or less).

Figure 15:
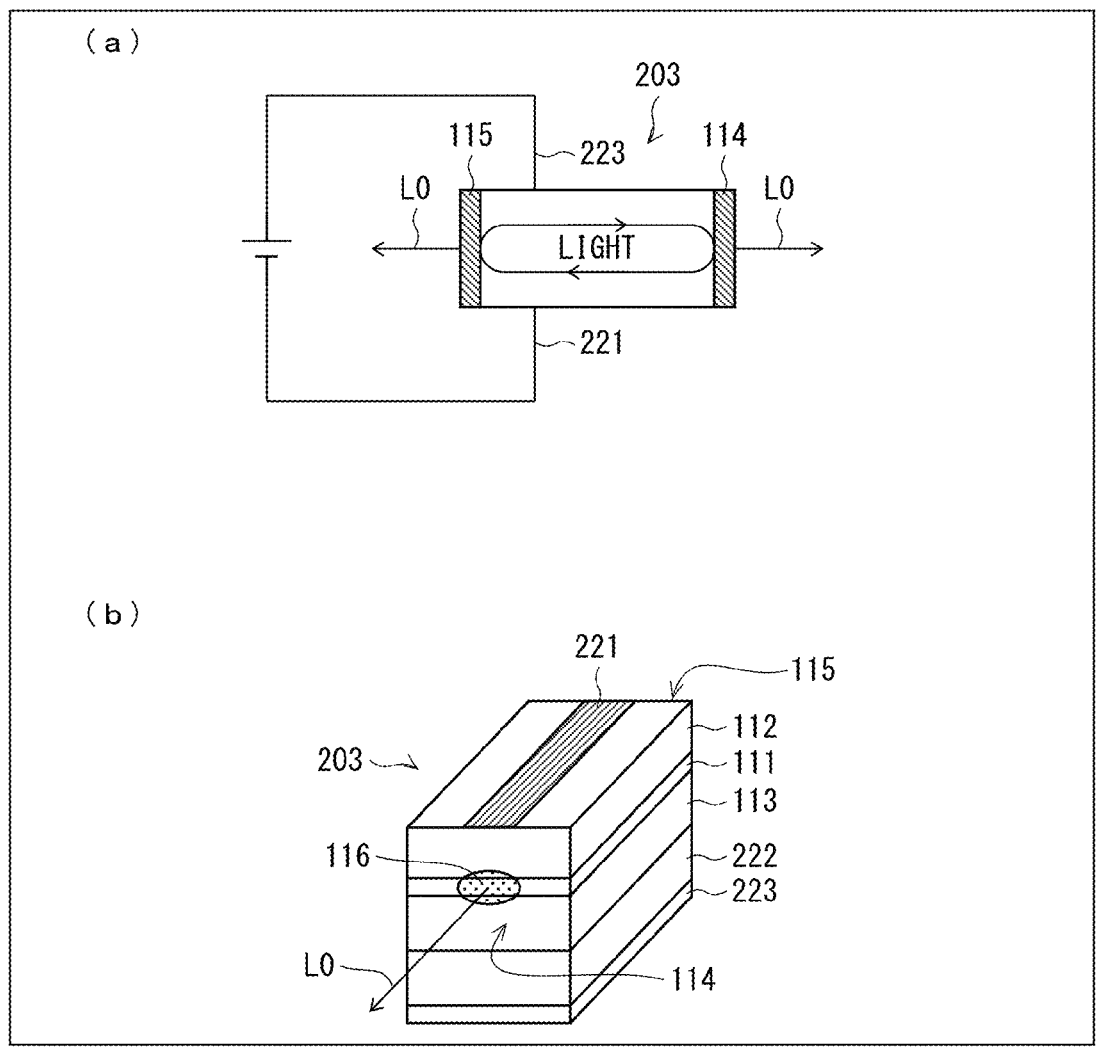
FIG. 15(a) is a circuit diagram schematically illustrating a semiconductor laser.
FIG. 15(b) is a perspective view illustrating a basic structure of the semiconductor laser.

FIG. 15(a) is a circuit diagram schematically illustrating the semiconductor laser 203, and FIG. 15(b) is a perspective view illustrating a basic structure of the semiconductor laser 203. As illustrated in FIGS. 15(a) and 15(b), the semiconductor laser 203 has a configuration in which a cathode electrode 223, a substrate 222, a clad layer 113, an active layer 111, a clad layer 112, and an anode electrode 221 are laminated in this order.

The substrate 222 is a semiconductor substrate, and preferably uses GaN, sapphire, or SiC in order to obtain blue to ultraviolet laser light for exciting a fluorescent substance as in the present specification. Generally, other examples of materials of a substrate for a semiconductor laser may include group IV semiconductors such as Si, Ge, and SiC, III-V group compound semiconductors represented by GaAs, GaP, InP, AlAs, GaN, InN, InSb, GaSb, and AlN, group II-VI compound semiconductors such as ZnTe, ZeSe, ZnS, and ZnO, oxide insulating materials such as ZnO, $Al_2O_3$, $SiO_2$, $TiO_2$, $CrO_2$, and $CeO_2$, and a nitride insulating material such as SiN.

The anode electrode 221 is used to inject a current into the active layer 111 via the clad layer 112.

The cathode electrode 223 is used to inject a current into the active layer 111 from the bottom of the substrate 222 via the clad layer 113. In addition, the injection of a current is performed by applying a forward bias to the anode electrode 221 and the cathode electrode 223.

The active layer 111 has a structure in which the layer is interposed between the clad layer 113 and the clad layer 112.

In addition, as a material of the active layer 111 and the clad layers, a mixed crystal semiconductor made of AlInGaN is used for obtaining blue to ultraviolet laser light. Generally, a mixed crystal semiconductor which has Al, Ga, In, As, P, N, and Sb as a main composition is be used in an active layer and a clad layer of a semiconductor laser, and the active layer and the clad layers may have such a configuration. Further, the active layer and the clad layers may be made of group II-VI compound semiconductors such as Zn, Mg, S, Se, Te, and ZnO.

In addition, the active layer 111 is a region where emission is generated by the injected current, and the generated light is confined in the active layer 111 due to a refractive index difference between the clad layer 112 and the clad layer 113.

Further, the active layer 111 is provided with a front cleavage surface 114 and a rear cleavage surface 115 which are opposing each other so as to confine light which is amplified due to stimulated emission, and the front cleavage surface 114 and the rear cleavage surface 115 function as a mirror.

However, unlike in a mirror which completely reflects light, some of light amplified due to stimulated emission is emitted from the front cleavage surface 114 or the rear cleavage surface 115 (in the present embodiment, for convenience of description, the front cleavage surface 114) of the active layer 111, and forms laser light L0. In addition, the active layer 111 may be formed in a multilayer quantum well structure.

Further, a reflective film (not illustrated) is formed on the rear cleavage surface 115 opposing the front cleavage surface 114, and there is a refractive index difference between the front cleavage surface 114 and the rear cleavage surface 115, thereby enabling most of the laser light L0 to be emitted from, for example, a light emitting point 116 on the front cleavage surface 114 which is a low refractive index end surface.

The clad layer 113 and the clad layer 112 may be made of either one of group III-V compound semiconductors represented by n type or p type GaAs, GaP, InP, AlAs, GaN, InN, InSb, GaSb, and AlN, and; group II-VI compound semiconductors such as ZnTe, ZeSe, ZnS, and ZnO, and inject a current into the active layer 111 when a forward bias is applied to the anode electrode 221 and the cathode electrode 223.

A film of each semiconductor layer such as the clad layer 113, the clad layer 112, and the active layer 111 may be formed using a general film forming method such as a metal organic chemical vapor deposition (MOCVD) method, a molecular beam epitaxy (MBE) method, a chemical vapor deposition (CVD) method, a laser ablation method, or a sputtering method. A film of the metal layer may be formed using a general film forming method such as a vacuum deposition method, a plating method, a laser ablation method, or a sputtering method.

The excitation light source 203 is disposed at a predetermined position outside the reflector 209 (more specifically, a position outside an excitation light incident opening 209c provided in the reflector 209), and emits the laser light C1 toward the light emitting portion 205 via the opening 209c.

Here, the opening 209c, as illustrated in FIG. 11, is formed at a location including a point in which a predetermined virtual line L2 which passes through the focal position P1 of the reflector 209 and is perpendicular to the central line L1 passes through the reflector 209. In addition, a position where the opening 209c is formed is not limited thereto. If an emission direction of the laser light C1 emitted from the excitation light source 203 is different from the illumination direction H, the excitation light incident opening 209c may be formed at any location of the reflector 209. In other words, the excitation light source 203 may be disposed at any location outside the reflector 209 if an emission direction of the laser light C1 emitted from the excitation light source 203 is different from the illumination direction H.

The excitation light termination portion 211 terminates the excitation light C1 which is emitted from the excitation light source 203 and is not absorbed by but passes through the light emitting portion 205.

In addition, the termination indicates that the excitation light C1 is terminated by a diffusion reflective body or an absorption body having an appropriate reflectance and an appropriate thermal characteristic in an end of an effective light path. Here, the appropriate reflectance is a reflectance at which, even if the excitation light C1 is reflected, the excitation light C1 is output to an extent that an output level of the reflected excitation light C1 does not damage a person, and the appropriate thermal characteristic indicates that the excitation light termination portion 211 has heat conductivity at which the excitation light is diffused to an extent that local heat generated when the excitation light C1 is absorbed does not destroy the excitation light termination portion 211.

(Excitation Light Termination Portion 211)

The excitation light termination portion 211 is disposed at a position on the reflector 209, opposing the excitation light source 203, via the light emitting portion 205. An excitation light emitting opening 209d is formed at the corresponding installation position of the reflector 209.

Figure 12:
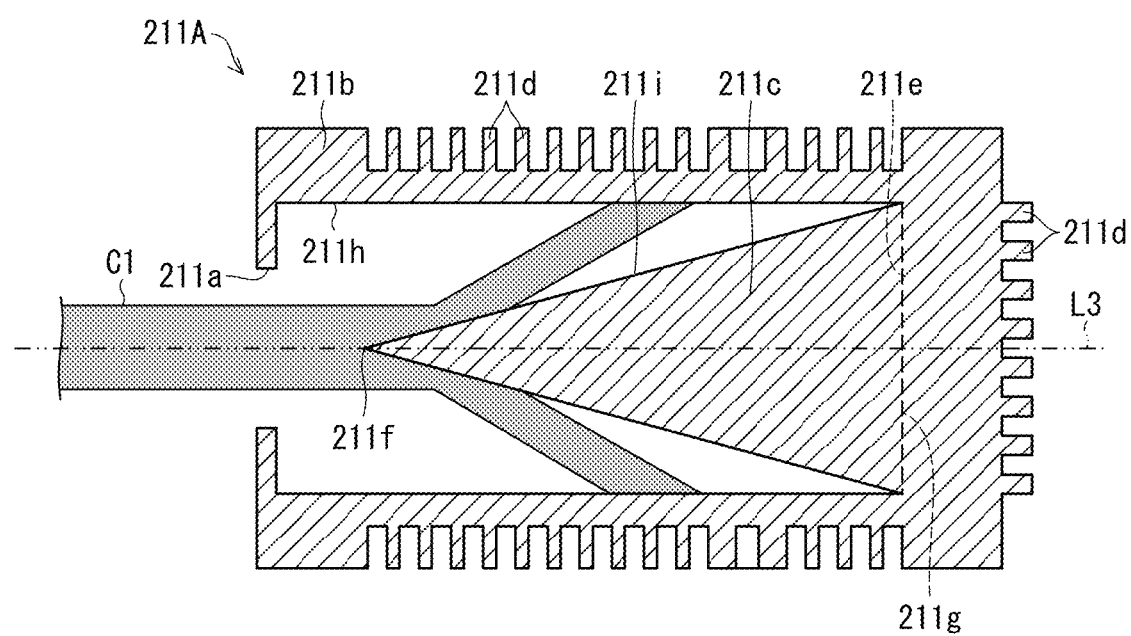
FIG. 12 is a cross-sectional view illustrating an excitation light termination portion of FIG. 11.

Here, the excitation light termination portion 211 is formed as a beam damper 211A, for example, as illustrated in FIG. 12. The beam damper 211A includes a closed-end cylindrical part 211b having an opening 211a to which the excitation light C1 is incident, a tapered part 211c formed on a bottom 211e of the closed-end cylindrical part 211b, and heat dissipation fins 211d formed on an outer surface of the closed-end cylindrical part 211b.

The closed-end cylindrical part 211b is disposed such that a cylindrical axis direction L3 is parallel to an opposed direction (the same direction as L2) of the excitation light termination portion 211 (that is, the beam damper 211A) and the excitation light source 203. In addition, the opening 211a of the closed-end cylindrical part 211b is disposed so as to oppose the excitation light emitting opening 209d.

The tapered part 211c is formed so as to taper toward the opening 211a side from the bottom 211e side of the closed-end cylindrical part 211b along the cylindrical axis direction L3. A front end 211f thereof is sharp, and a base end surface 211g thereof is formed in the same size as the bottom 211e. In other words, a gap between an inner surface 211h of the closed-end cylindrical part 211b and an outer circumferential surface 211i of the tapered part 211c gradually decreases from the opening 211a side to the bottom 211e side, and becomes zero on the bottom 211e. Accordingly, the excitation light C1 which is incident on the inside of the beam damper 211A from the opening 211a is repeatedly reflected between the inner surface 211h of the closed-end cylindrical part 211b and the outer circumferential surface 211i of the tapered part 211c, propagates to the inside of the closed-end cylindrical part 211b, attenuates, and disappears without being reflected toward the opening 211a side.

In addition, a black coating (a black non-reflection coating) which does not reflect the excitation light C1 is formed on the inner surface 211h of the closed-end cylindrical part 211b and the outer circumferential surface 211i of the tapered part 211c. Accordingly, it is possible to increase an effect of attenuating the excitation light C1.

In addition, a diameter of the opening 211a is preferably set to an appropriate size so that the excitation light C1 which is emitted from the excitation light source 203 and is transmitted through the light emitting portion 205 is incident on the inside of the beam damper 211A even in a case where an emission direction of the excitation light C1 of the excitation light source 203 is deviated.

(Auxiliary Illumination Light Source 207)

The auxiliary illumination light source 207 is constituted by, for example, a light emitting diode. The auxiliary illumination light source 207 emits light (for example, blue light or bluish violet light) with a wavelength different from a wavelength of the excitation light C1 (for example, ultraviolet rays or bluish violet light) emitted from the excitation light source 203, as the auxiliary illumination light C2.

Here, the auxiliary illumination light source 207 emits natural light (non-excitation light), but may emit excitation light.

In addition, the auxiliary illumination light source 207 may include a light emitting element which emits natural light, and a fluorescent substance which receives the light from the light emitting element and emits white light. Accordingly, it is possible to emit white light from the auxiliary illumination light source 207. Therefore, in a case where the light emitting portion 205 is deviated, and thus the illumination light C4 is formed only by the auxiliary illumination light C2 from the auxiliary illumination light source 207, the white illumination light C4 can be emitted.

The auxiliary illumination light source 207 is disposed at a predetermined position outside the reflector 209 (more specifically, a position opposing an auxiliary illumination light incident opening 209e formed in the reflector 209), and emits the auxiliary illumination light C2 toward the light emitting portion 205 via the opening 209e.

Here, the opening 209e is formed at a top of the reflector 209 (that is, a location including a point in which a virtual line L4 which passes through the focal position P1 of the reflector 209 and is parallel to the central line L1 passes through the reflector 209). In addition, a position where the opening 209e is formed is not limited thereto. The opening 209e may be formed at any position as long as the auxiliary illumination light C2 which is emitted from the auxiliary illumination light source 207 can be applied to the light emitting portion 205 via the opening 209e.

(Regarding Absorptances for Excitation Light C1 and Auxiliary Illumination Light C2 in Light Emitting Portion 205)

The light emitting portion 205 has a characteristic that absorptance for the auxiliary illumination light C2 is higher than absorptance for the excitation light C1. For example, in a case where the auxiliary illumination light C2 from the auxiliary illumination light source 207 is blue light or bluish violet light, and the excitation light C1 from the excitation light source 203 is ultraviolet light or bluish violet light, the fluorescent substance preferably has high outside quantum efficiency (60% or more) when excited with ultraviolet rays or bluish violet light, and has absorptance for blue or bluish violet light of 40% or less.

In this case, in the light emitting portion 205, as the absorptance for the excitation light C1 becomes higher, conversion efficiency of converting the excitation light C1 into non-excitation light increases. In addition, in the light emitting portion 205, the absorptance for the auxiliary illumination light C2 becomes lower, transmittance of the auxiliary illumination light C2 transmitted through the light emitting portion 205 increases, and thus the auxiliary illumination light C2 can be easily utilized as the illumination light C4 along with the non-excitation light.

In other words, the light emitting portion 205 has relatively high conversion efficiency of converting the excitation light C1 into non-excitation light, and also has a relatively high transmittance of the auxiliary illumination light C2 transmitted through the light emitting portion 205. Therefore, the auxiliary illumination light C2 can be easily utilized as the illumination light along with the non-excitation light without damaging the conversion efficiency of converting the excitation light C1 into the non-excitation light.

(Excitation Light Cutoff Filter 213)

The excitation light cutoff filter 213 is disposed so as to cover the illumination light opening 209b of the reflector 209. In other words, the excitation light cutoff filter 213 is disposed on the illumination direction H side when viewed from the light emitting portion 205.

In the excitation light cutoff filter 213, preferably, a transmittance of the excitation light C1 emitted from the excitation light source 203 is 10% or less, and a transmittance of the auxiliary illumination light C2 emitted from the auxiliary illumination light source 207 is 70% or less, in order to prevent the excitation light C1 emitted from the excitation light source 203 from being emitted to outside of the illumination apparatus 201. In addition, the excitation light cutoff filter 213 may be omitted.

(2. Operation)

Next, with reference to FIG. 11, an operation of the illumination apparatus 201 will be described.

The excitation light C1 emitted from the excitation light source 203 is applied to the light emitting portion 205 in the reflector 209 via the opening 209c. Most of the excitation light C1 from the excitation light source 203 is absorbed by the light emitting portion 205 so as to excite the phosphor. Fluorescence (non-excitation light) C3 is emitted from the light emitting portion 205 excited by the excitation light C1 in all directions, and the fluorescence C3 converges on the parabolic reflective surface 209a of the reflector 209 in the illumination direction H so as to be transmitted through the excitation light cutoff filter 213, and is emitted to the outside of the illumination apparatus 201 from the opening 209b of the reflector 209.

At this time, some of the excitation light C1 from the excitation light source 203 is not absorbed by the light emitting portion 205 and is scattered or diffused at the light emitting portion 205, so as to converge on the parabolic reflective surface 209a of the reflector 209 in the illumination direction H, and is then absorbed by the excitation light cutoff filter 213. Accordingly, the excitation light C1 which is scattered or diffused at the light emitting portion 205 is prevented from being emitted to the outside of the illumination apparatus 201.

In addition, some of the excitation light C1 (the excitation light C1 which is not absorbed by the light emitting portion 205) from the excitation light source 203 is transmitted through the light emitting portion 205 so as to be incident on the excitation light termination portion 211 via the opening 209d of the reflector 209, and is absorbed by the excitation light termination portion 211 so as to be terminated. Accordingly, the excitation light C1 which is emitted from the excitation light source 203 and is transmitted through the light emitting portion 205 is prevented from being reflected by the parabolic reflective surface 209a of the reflector 209 and being emitted to the outside of the illumination apparatus 201. Further, of some of the excitation light C1 which is not absorbed by the light emitting portion 205, there is also light which is not directed to the excitation light termination portion 211 and is directed to the opening 209b of the reflector 209 in the illumination direction H as a result of being scattered or diffused at the light emitting portion 205.

On the other hand, the auxiliary illumination light C2 emitted from the auxiliary illumination light source 207 is applied to the light emitting portion 205 in the reflector 209 via the opening 209e, travels along a path in which the auxiliary illumination light is transmitted through the light emitting portion 205, is scattered inside the light emitting portion 205, or reflected on the surface of the light emitting portion 205, or along combined paths thereof, forms the illumination light C4 together with the fluorescence C3 emitted from the light emitting portion 205, and is emitted to the outside from the opening 209b of the reflector 209.

In addition, the auxiliary illumination light C2 which is transmitted through the light emitting portion 205 is not reflected by the parabolic reflective surface 209a of the reflector 209 but propagates in the illumination direction H, and is emitted from the opening 209b of the reflector 209 along with the fluorescence C3. Further, the auxiliary illumination light C2 which is scattered or reflected at the light emitting portion 205 is reflected by the parabolic reflective surface 209a of the reflector 209 in the illumination direction H, and is emitted to the outside from the opening 209b of the reflector 209 along with the fluorescence C3.

As above, in the illumination apparatus 201, the illumination light C4 is formed by composite light of the fluorescence C3 emitted from the light emitting portion 205 and the auxiliary illumination light C2 which is transmitted through, scattered or reflected at the light emitting portion 205. In other words, the illumination light C4 is formed by a mixed color of the fluorescence C3 and the auxiliary illumination light C2.

(Main Effects)

With this configuration, in the illumination apparatus 201, the highly coherent laser light C1 is not emitted to the outside of the illumination apparatus 201, and thus it is possible to provide an illumination apparatus which is safe to a person's eye. In addition, even if the light emitting portion 205 is deviated, the excitation light cutoff filter 213 and the excitation light termination portion 211 are provided, and thus the excitation light C1 is not emitted to the outside of the illumination apparatus 201.

Further, the auxiliary illumination light C2 from the auxiliary illumination light source 207 is emitted to the outside regardless of whether or not the light emitting portion 205 is located at a desired position. Even in a case where the light emitting portion 205 is deviated from a predetermined position, the illumination light C4 is emitted to the outside of the illumination apparatus 201, and thus can be prevented from not being emitted from the illumination apparatus 201. Accordingly, even if the light emitting portion 205 is deviated from a predetermined position and thus the fluorescence C3 is not emitted from the light emitting portion 205, it is possible to inform the surrounding people of the presence of the illumination apparatus 201.

In addition, a color temperature of the illumination light C4 is different in a case where the fluorescence C3 is included in the illumination light C4 and a case where the fluorescence C3 is not included therein, and thus it is possible to inform people other than a user of the illumination apparatus 201 (a person who can control a driving state of the excitation light source 203, and, at least emission and non-emission of the excitation light C1 from the excitation light source 203 at will) of the illumination apparatus 201 of abnormality of the illumination apparatus 201 (abnormality such as a positional deviation of the light emitting portion 205, a hole being formed in the light emitting portion 205, or the like).

In addition, an output (that is, a wavelength) of the auxiliary illumination light C2 from the auxiliary illumination light source 207 is arbitrarily adjusted, and thus it is possible to change chromaticity of the illumination light C4.

Further, in the illumination apparatus 201, for the purpose of increasing a color temperature (or adding light in a blue region) of the fluorescence C3 emitted from the light emitting portion 205 while exciting the light emitting portion 205 with the excitation light C1 having, for example, a wavelength around 405 nm or a wavelength of 405 nm or less, the blue laser light C2 is applied to the light emitting portion 205 so as to scatter or diffuse the blue laser light C2 at the light emitting portion 205, thereby making the fluorescence C3 emitted from the light emitting portion 205 incoherent.

Accordingly, it is possible to improve a color temperature of the fluorescence C3 emitted from the light emitting portion 205 without increasing a size of the light emitting portion 205 of the illumination apparatus 201. Therefore, it is possible to increase a color temperature while maintaining high luminance emission characteristics. In addition, in circumstances in which a blue fluorescent substance having high efficiency is not nearly developed, it is possible to implement a solid-state illumination apparatus having a high color temperature and a good color rendering property with high efficiency.

MODIFICATION EXAMPLE 1

Although, in the above-described embodiment, the excitation light termination portion 211 is constituted by the beam damper 211A, in this modification example, the excitation light termination portion 211 is constituted by an integrating sphere 211B which scatters the excitation light C1 for attenuation therein.

Figure 13:
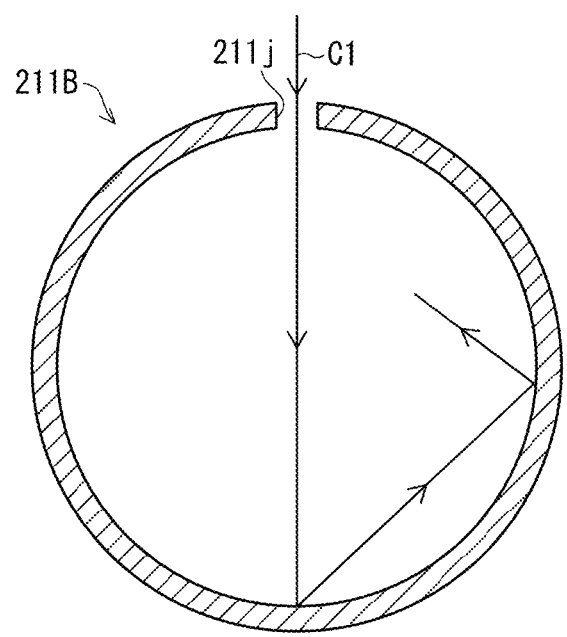
FIG. 13 is a cross-sectional view illustrating a modification example of the excitation light termination portion.

The integrating sphere 211B, as illustrated in FIG. 13, is formed in a hollow spherical shape, and has a small light incident hole 211j to which the excitation light C1 is incident. The integrating sphere 211B is disposed so that the light incident hole 211j faces the opening 209d of the reflector 209 in the outside of the reflector 209. Accordingly, the excitation light C1 which is transmitted through the light emitting portion 205 and is incident on the opening 209d can be made to be incident on the inside of the integrating sphere 211B from the light incident hole 211j.

In the integrating sphere 211B, the excitation light C1 which is incident on the inside of the integrating sphere 211B from the light incident hole 211j is scattered inside the integrating sphere 211B, attenuates, and disappears.

In addition, a black powder substance or the like which absorbs the excitation light C1 may coat the inside of the integrating sphere 211B. Accordingly, it is possible to more effectively attenuate the excitation light C1 inside the integrating sphere 211B.

MODIFICATION EXAMPLE 2

Figure 14:
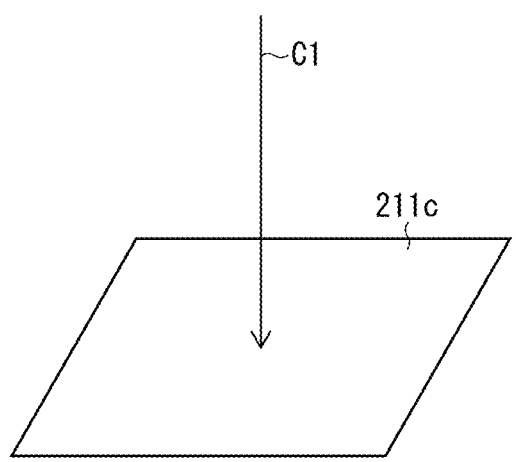
FIG. 14 is a perspective view illustrating another modification example of the excitation light termination portion.

Although, in the above-described embodiment, the excitation light termination portion 211 is constituted by the beam damper 211A, in this modification example, the excitation light termination portion 211 is constituted by a light absorbing member 211C which absorbs the excitation light C1. The light absorbing member 211C, for example, as illustrated in FIG. 14, is formed as, for example, a laser curtain (that is, a sheet member made of a light absorbing material such as soft vinyl chloride). The light absorbing member 211C is disposed so as to face the opening 209d of the reflector 209 in the outside of the reflector 209. Accordingly, the light absorbing member 211C can absorb the excitation light C1 which is transmitted through the light emitting portion 205 and is incident on the opening 209d, so as to make the excitation light C1 disappear.

In addition, although a case where the light absorbing member 211C has a sheet shape has been described here, the light absorbing member is not limited to the sheet shape.

[Embodiment 8]

Figure 16:
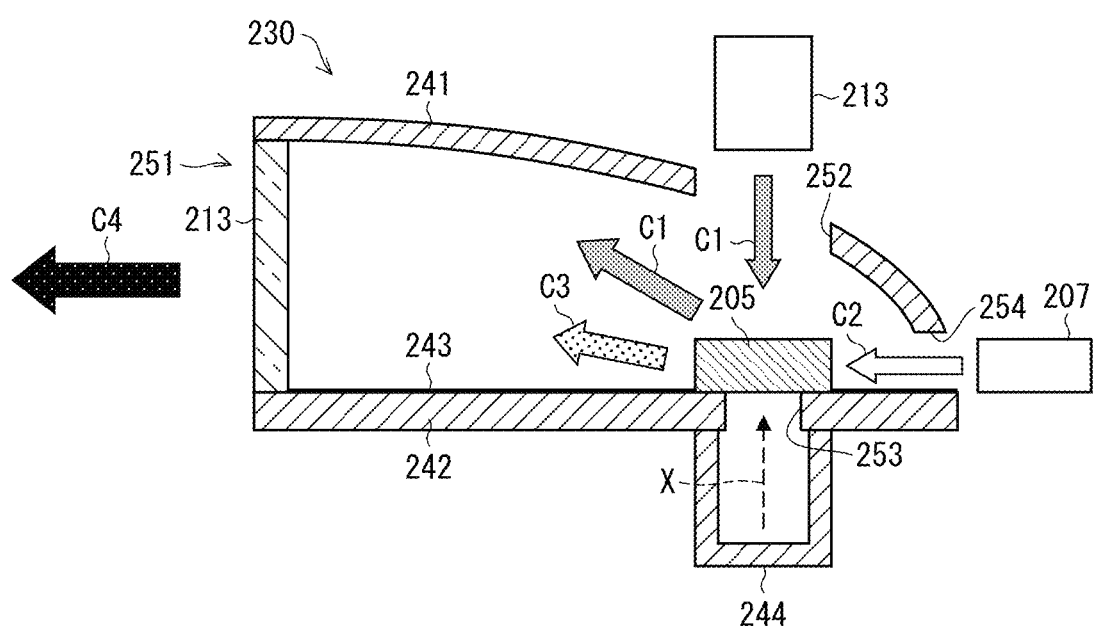
FIG. 16 is a cross-sectional view illustrating a configuration of an illumination apparatus according to another embodiment of the present invention.

Next, Embodiment 8 of the present invention will be described. FIG. 16 is a schematic configuration diagram of an illumination apparatus according to Embodiment 8 of the present invention. In addition, the same members as in Embodiment 7 are given the same reference numerals, and description thereof will be omitted.

A difference between an illumination apparatus 230 according to Embodiment 8 of the present invention and the illumination apparatus 201 according to Embodiment 7 is that a parabola mirror (a reflective portion) 241 and a metal plate (a reflective portion) 242 are provided instead of the reflector 209. In addition, an excitation light termination portion 244 is provided instead of the excitation light termination portion 211.

(Parabola Mirror 241)

The parabola mirror 241 reflects fluorescence (non-excitation light) C3 generated by the light emitting portion 205, so as to form beams of light flux (illumination light) which travel at a solid angle within a predetermined range. The parabola mirror 241 may be a member in which, for example, a metal thin film is formed on the surface thereof, or may be a member made of metal.

A part of the parabola mirror 241 is disposed over the upper surface of the light emitting portion 205. In other words, the parabola mirror 241 is disposed at the position covering the upper surface of the light emitting portion 205. When described from another viewpoint, a part of the side surface of the light emitting portion 205 faces toward an illumination light opening 251 which is one opening of the parabola mirror 241.

A positional relationship between the light emitting portion 205 and the parabola mirror 241 has the above-described positional relationship, and thus it is possible to increase efficiency of collecting the non-excitation light C3 of the light emitting portion 205 at a solid angle within a predetermined range, thereby increasing use efficiency of the non-excitation light C3.

In addition, the excitation light source 203 is disposed outside the parabola mirror 241, and an excitation light incident opening 252 which allows the laser light C1 to pass therethrough is formed in the parabola mirror 241. The excitation light incident opening 252 is a hole which penetrates through the outside (the excitation light source 203 side) and the inside (the light emitting portion 205 side) of the parabola mirror 241.

On the other hand, the auxiliary illumination light C2 emitted from the auxiliary illumination light source 207 is applied to the light emitting portion 205 in the parabola mirror 241 via an auxiliary illumination light incident opening 254 which is the other opening of the parabola mirror 241, travels along a path in which the auxiliary illumination light is transmitted through the light emitting portion 205, scattered inside the light emitting portion 205, or reflected on the surface of the light emitting portion 205, or combined paths thereof, forms the illumination light C4 together with the fluorescence C3 emitted from the light emitting portion 205, and is emitted to the outside from the opening 251 of the parabola mirror 241.

In addition, instead of the parabola mirror 241, an elliptical mirror or a hemispherical mirror may be used.

(Metal Plate 242)

The metal plate 242 is a plate-shaped support member which supports the light emitting portion 205, and is made of metal (for example, copper or iron). Therefore, the metal plate 242 has high heat conductivity, and thus can cool the light emitting portion 205. In addition, a member supporting the light emitting portion 205 is not limited to being made of metal, and may be a member including a substance (glass, sapphire, or the like) having high heat conductivity other than the metal.

A metal thin film 243 is deposited on a surface (excluding a surface joined to the light emitting portion 205) of the metal plate 242 on the parabola mirror 241 side, and reflects the non-excitation light C3 emitted from the light emitting portion 205. The excitation light C1 which is incident from the upper surface of the light emitting portion 205 can be converted into the non-excitation light C3 which is then reflected so as to travel toward the parabola mirror 241 side. In this way, it is possible to improve use efficiency of the non-excitation light C3.

The metal plate 242 is covered by the parabola mirror 241, and thus it can be said that the metal plate 242 has a surface facing the reflective surface of the parabola mirror 241. The surface of the metal plate 242 on the parabola mirror 241 side is substantially parallel to a rotation axis of a rotation of a parabolic surface of the parabola mirror 241 and substantially includes the rotation axis.

In addition, although not illustrated, the metal plate 242 may have fins. These fins function as a cooling portion which cools the metal plate 242. The fins have a plurality of heat dissipation plates, and increases heat dissipation efficiency by increasing contact area with the air. The cooling portion which cools the metal plate 242 may use a heat pipe instead of the fins or may employ a water cooling method or an air cooling method as long as it has a cooling (heat dissipation) function.

(Excitation Light Termination Portion 244)

The excitation light termination portion 244 is disposed at a position of the metal plate 242, opposing the excitation light source 203 via the light emitting portion 205. An excitation light emitting opening 253 is formed at the position where the metal plate 242 is disposed. In addition, a structure of the excitation light termination portion 244 is the same as that of the excitation light termination portion 211 of Embodiment 7, and repeated description will be omitted here.

Figure 17:
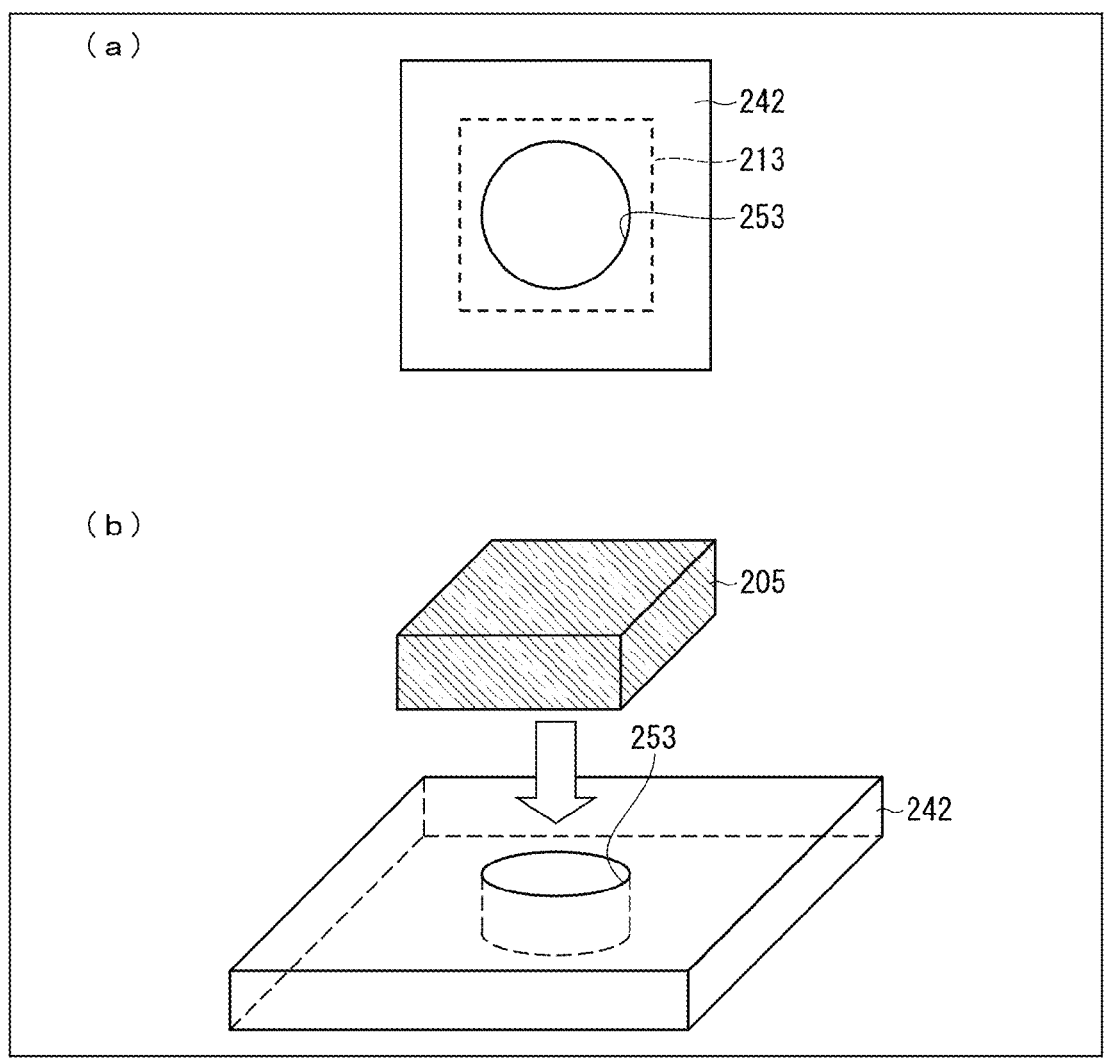

FIG. 17 is a diagram illustrating a positional relationship between the light emitting portion 205, the metal plate 242, and the excitation light emitting opening 253, in which FIG. 17(a) is a conceptual diagram which is viewed from the arrow X direction of FIG. 16, and FIG. 17(b) is a conceptual diagram illustrating a method in which the light emitting portion 205 is disposed on the excitation light emitting opening 253 of the metal plate 242. As illustrated in FIG. 17, the light emitting portion 205 is disposed on the excitation light emitting opening 253.

Some of the excitation light C1 (the excitation light C1 which is not absorbed by the light emitting portion 205) from the excitation light source 203 is transmitted through the light emitting portion 205 so as to be incident on the excitation light termination portion 244 via the opening 253 of the metal plate 242, and is absorbed by the excitation light termination portion 244 so as to be terminated. Accordingly, the excitation light C1 which is emitted from the excitation light source 203 and is transmitted through the light emitting portion 205 is prevented from being reflected by the parabola mirror 241 and the metal plate 242 and thus from being emitted to outside of the illumination apparatus 230.

In addition, the present invention is not limited to the above-described embodiments, and may have various modifications in the scope shown in the claims. In other words, embodiments obtained by combining appropriately modified technical means in the scope shown in the claims are also included in the technical scope of the present invention.

As described above, a detection unit according to the present embodiment includes detection means for detecting a relative positional relationship between an excitation light source, an optical member, and a light emitting portion in a light emitting device in which excitation light emitted from the excitation light source is collected at the light emitting portion via the optical member so that the light emitting portion is made to emit light; and determination means for comparing a detection result from the detection means with a reference relative positional relationship which is used as a reference for a relative positional relationship between the excitation light source, the optical member, and the light emitting portion, so as to determine whether or not there is a deviation of the relative positional relationship between the excitation light source, the optical member, and the light emitting portion when the detection means performs the detection, from the reference relative positional relationship.

The reference relative positional relationship is preferably set in advance based on at least one of an area of an irradiation region on the light emitting portion and a position of the irradiation region on the light emitting portion in relation to excitation light collected at the light emitting portion.

According to the above configuration, it is possible to detect a deviation in a case where excitation light is deviated from a desired state and is applied to the light emitting portion, that is, the excitation light is applied to the light emitting portion in a more concentrated state than in the desired state or in a more diffused state than in the desired state.

Preferably, the detection unit further includes a laser light source that emits laser light from one of an excitation light source support surface supporting the excitation light source and a light emitting portion support surface supporting the light emitting portion toward the other surface; and a light receiving portion that receives return light which is reflected from the other surface and then returns to one surface, of laser light beams emitted from the laser light source. Here, the detection means preferably acquires a focal shape of the return light on the light receiving portion from the light receiving portion as a result of the detection performed by the detection means, and the determination means preferably determines that there is the deviation in a case where a reference focal shape which is a focal shape on the light receiving portion is compared with the focal shape on the light receiving portion, acquired by the detection means, and there is a change between the two focal shapes, when a relative positional relationship between the excitation light source, the optical member, and the light emitting portion is set as the reference relative positional relationship.

According to the above configuration, a change in a focal shape on the light receiving portion is determined, and thus it is possible to detect a deviation of a relative positional relationship between the excitation light source, the optical member, and the light emitting portion at a high speed with high accuracy.

Preferably, the laser light source is used as the excitation light source of the light emitting device, the positional deviation detection unit further includes an optical function filter that blocks light emitted from the light emitting portion and transmits the return light therethrough, and the optical function filter is disposed on a light receiving surface side receiving light of the light receiving portion.

According to the above configuration, the light emitting device can include the excitation light source and the laser light source as the same light source, and can prevent light emitted from the light emitting portion from being received by the light receiving portion by using the optical function filter. For this reason, it is not necessary to constitute a laser light source and an optical system thereof, the detection unit can be miniaturized and simplified, and the light receiving portion receives only excitation light from the excitation light source. Therefore, a deviation of a relative positional relationship between the excitation light source, the optical member, and the light emitting portion can be detected with high accuracy based on a deviation from the reference relative positional relationship.

Preferably, the detection unit further includes a camera that is disposed in at least one of an excitation light source support member supporting the excitation light source and an optical member support member supporting the optical member; and a marker that is included in an imaging region of the camera. Here, preferably, the marker includes at least one of a marker which is included in an imaging region of a camera disposed in the excitation light source support member and is disposed in the optical member support member and a marker which is included in an imaging region of a camera disposed in the optical member support member and is disposed in a light emitting portion support member supporting the light emitting portion, the detection means acquires an imaging result in which the camera captures an image of the marker, as a result of the detection performed by the detection means, and the determination means determines that there is the deviation in a case where an imaging result from the camera is compared with the imaging result acquired by the detection means, and there is a change between the two imaging results when a relative positional relationship between the camera and the marker is set as the reference relative positional relationship.

According to the above configuration, a change in an imaging result of the marker by the camera is determined, and thus it is possible to detect a deviation of a relative positional relationship between the excitation light source, the optical member, and the light emitting portion at a high speed with high accuracy.

In addition, a light emitting device according to the present embodiment includes an excitation light source that emits excitation light; an optical member that collects the excitation light emitted from the excitation light source; a light emitting portion that is made to emit light by using the excitation light collected by the optical member; a positional deviation detection unit that detects a deviation in a relative positional relationship between the excitation light source, the optical member, and the light emitting portion; and a positional deviation adjustment unit that adjusts the deviation detected by the positional deviation detection unit, in which the positional deviation detection unit includes detection means for detecting a relative positional relationship between the excitation light source, the optical member, and the light emitting portion; and determination means for comparing a detection result from the detection means with a reference relative positional relationship which is used as a reference for a relative positional relationship between the excitation light source, the optical member, and the light emitting portion, so as to determine whether or not there is a deviation of the relative positional relationship between the excitation light source, the optical member, and the light emitting portion when the detection means performs the detection, from the reference relative positional relationship, and in which the positional deviation adjustment unit adjusts a deviation detected by the positional deviation detection unit by returning the relative positional relationship between the excitation light source, the optical member, and the light emitting portion to the reference relative positional relationship when the deviation is detected by the positional deviation detection unit.

The reference relative positional relationship is preferably set in advance based on at least one of the area of an irradiation region on the light emitting portion and the position of the irradiation region on the light emitting portion in relation to excitation light collected at the light emitting portion.

According to the above configuration, it is possible to detect a deviation in a case where excitation light is deviated from a desired state and is applied to the light emitting portion, that is, the excitation light is applied to the light emitting portion in a more concentrated state than in the desired state or in a more diffused state than in the desired state.

The positional deviation adjustment unit preferably includes a movement mechanism that moves a position of at least one of the excitation light source, the optical member, and the light emitting portion.

According to the above configuration, it is possible to appropriately return a relative positional relationship to the reference relative positional relationship by moving a position of at least one of the excitation light source, the optical member, and the light emitting portion. Accordingly, it is possible to prevent an irradiation position of the excitation light from deviating from the light emitting portion. In addition, it is possible to apply the excitation light to the light emitting portion with the desired irradiation area.

Therefore, it is possible to delay deterioration in the light emitting portion due to the excitation light being applied to the light emitting portion in a more concentrated manner than in a desired state, to prevent luminance from being greatly increased, or to prevent danger from the viewpoint of eye safety. In addition, conversely, it is also possible to prevent desired optical characteristics from not being obtained due to luminance lowered when the excitation light is applied to the light emitting portion in a less concentrated manner than in the desired state.

The movement mechanism preferably fixes the excitation light source and the light emitting portion and moves the optical member.

According to the above configuration, it is possible to maintain a relative positional relationship between the excitation light source, the optical member, and the light emitting portion in a reference relative positional relationship by moving a position of the optical member. Accordingly, since a target moved by the positional deviation adjustment unit is only the optical member, the positional deviation adjustment unit can be miniaturized and simplified.

In addition, a light emitting device according to the present embodiment includes an excitation light source that emits excitation light; an optical member that collects the excitation light emitted from the excitation light source; a light emitting portion that is made to emit light by using the excitation light collected by the optical member; and an elastic member that maintains a relative positional relationship between the excitation light source, the optical member, and the light emitting portion.

The light emitting device preferably further includes a reflection mirror that reflects light emitted from the light emitting portion.

According to the above configuration, it is possible to reflect light emitted from the light emitting portion in a desired direction by using the reflection mirror.

The excitation light source is preferably a laser light source.

According to the above configuration, laser light is easily collected by an optical system. For this reason, it is possible to implement a high output and high luminance light emitting device, and it is possible to delay deterioration in the light emitting portion due to the excitation light being applied to the light emitting portion in a more concentrated manner than in a desired state, to prevent luminance from being greatly increased, or to prevent danger from the viewpoint of eye safety.

The laser light source is preferably a semiconductor laser light source.

According to the above configuration, the semiconductor laser is small, and thus the light emitting device can be miniaturized. In addition, if the light emitting device is miniaturized, it is possible to remarkably improve a degree of freedom of design of an illumination apparatus using the light emitting device.

Further, as described above, an illumination apparatus according to the present embodiment includes an excitation light source that emits excitation light in one direction; a light emitting portion that receives the excitation light so as to emit non-excitation light; and a reflective portion that reflects the non-excitation light in an illumination direction which is different from an emission direction of the excitation light.

The illumination apparatus preferably further includes an excitation light termination portion that terminates the excitation light at a position opposing the excitation light source via the light emitting portion.

According to the above configuration, since the excitation light termination portion is disposed at a position opposing the excitation light source via the light emitting portion, when a position of the light emitting portion is deviated or an optical axis of the excitation light is deviated and thus the excitation light is out of the light emitting portion, the excitation light from the excitation light source is incident on the excitation light termination portion so as to be terminated.

Therefore, it is possible to prevent the excitation light from being emitted to outside of the illumination apparatus even if a position of the light emitting portion is deviated or an optical axis of the excitation light is deviated and thus the excitation light is out of the light emitting portion.

The excitation light termination portion is preferably an integrating sphere that scatters and attenuates the excitation light therein.

According to the above configuration, the excitation light incident on the excitation light termination portion is scattered and attenuated therein, and finally disappears (that is, terminates). Therefore, it is possible to constitute the excitation light termination portion with the simple configuration.

The excitation light termination portion preferably includes a closed-end cylindrical part that has an opening to which the excitation light is incident; and a tapered part that is formed on a bottom of the closed-end cylindrical part so as to taper toward the opening side from the bottom side, and has a sharp front end and a base end surface with the same size as the bottom.

According to the above configuration, the excitation light which is incident on the inside of the excitation light termination portion from the opening is repeatedly reflected between the inner surface of the closed-end cylindrical part and the outer circumferential surface of the tapered part, and travels to the inside of the closed-end cylindrical part. In this excitation light termination portion, the front end of the tapered part is sharp, and the base end surface of the tapered part has the same size as the bottom (that is, the bottom of the closed-end cylindrical part completely occupies the tapered part).

Therefore, the excitation light which is incident on the excitation light termination portion from the opening is not reflected to the opening side and is attenuated for each reflection and finally disappears (that is, terminates) inside the excitation light termination portion. Therefore, it is possible to constitute the excitation light termination portion with the simple configuration.

The excitation light termination portion preferably includes a light absorbing member that absorbs the excitation light from the excitation light source.

According to the above configuration, since the excitation light termination portion includes the light absorbing member which absorbs light from the excitation light source, it is possible to constitute the excitation light termination portion with the simple configuration.

The illumination apparatus preferably further includes an auxiliary illumination light source that emits auxiliary illumination light.

According to the above configuration, when the light emitting portion is deviated from a predetermined location or an optical axis of the excitation light source is deviated and thus excitation light from the excitation light source does not arrive at the light emitting portion, it is possible to prevent having no illumination light being emitted from the apparatus.

For this reason, it is possible to solve a problem, which may occur in an illumination apparatus without the above-described configuration, in which an object cannot be recognized or/and surrounding people cannot be informed of the presence of the illumination apparatus in a case where there is no light source which emits light in order for the apparatus for recognizing a person or/and an object to recognize a person and an object or/and in order to inform the surrounding people of the presence of the illumination apparatus.

In other words, even in a case where a position of the light emitting portion is deviated or an optical axis of the excitation light source is deviated and thus the excitation light is out of the light emitting portion such that non-excitation light is not emitted, it is possible to ensure minimal illumination light by using the auxiliary illumination light source.

The auxiliary illumination light preferably has a wavelength different from a wavelength of the excitation light.

The illumination light is constituted by composite light of non-excitation light emitted from the light emitting portion which is excited by excitation light and auxiliary illumination light.

According to the above configuration, the auxiliary illumination light has a wavelength different from a wavelength of the excitation light, and thus the wavelength of the auxiliary illumination light is adjusted, thereby adjusting a color temperature of the illumination light.

In addition, if the wavelengths are different from each other, color temperatures are different from each other. Therefore, a color temperature of illumination light constituted by non-excitation light and auxiliary illumination light is different from a color temperature of illumination light constituted by only the auxiliary illumination light. Thus, it is possible to judge whether or not the illumination apparatus fails based on a color temperature of illumination light.

The light emitting portion preferably has a characteristic that absorptance for the excitation light is higher than absorptance for the auxiliary illumination light.

In the light emitting portion, as the absorptance for the excitation light becomes higher, conversion efficiency of converting the excitation light into non-excitation light increases. In addition, in the light emitting portion, as the absorptance for the auxiliary illumination light becomes lower, transmittance of the auxiliary illumination light transmitted through the light emitting portion increases, and thus the auxiliary illumination light can be easily utilized as the illumination light along with the non-excitation light.

Therefore, according to the above configuration, since the absorptance for the excitation light is higher than the absorptance for the auxiliary illumination light, conversion efficiency of converting the excitation light into non-excitation light is relatively high, and a transmittance of the auxiliary illumination light transmitted through the light emitting portion is relatively high. Accordingly, the auxiliary illumination light can be easily utilized as the illumination light along with the non-excitation light without damaging the conversion efficiency of converting the excitation light into the non-excitation light.

The illumination apparatus preferably further includes an excitation light cutoff filter that is disposed on the illumination direction side of the light emitting portion.

According to the above configuration, excitation light included in illumination light is removed by the excitation light cutoff filter. Thus, it is possible to prevent the excitation light from being mixed with the illumination light and being emitted to outside.

The auxiliary illumination light source preferably includes a light emitting element; and a fluorescent substance that receives light from the light emitting element so as to emit white light.

According to the above configuration, the auxiliary illumination light source can apply white auxiliary illumination light.

Industrial Applicability

The present invention can maintain the irradiation area on a light emitting portion to be constant and is thus suitable particularly for an illumination apparatus. In addition, the present invention is also applicable to a headlamp or the like of a vehicle.

Reference Signs List
2 Laser element (excitation light source, semiconductor laser)
4 Condensing lens (optical member)
24, 24a, and 24c Laser element
20, 20a, 20b, 20c, and 20d Positional deviation detection unit
21, 21a, 21b, 21c, and 21d Detection portion (detection means)
22, 22a, 22b, 22c, and 22d Determination portion (determination means)
30 and 30c Light receiving element (light receiving portion)
40, 40b, and 40c Positional deviation adjustment unit
52 and 53 Elastic member
73 Ferrule (optical member)
101, 102, 103, 104, 105, and 106 Light emitting device
201 and 230 Illumination apparatus
203 Excitation light source
205 Light emitting portion
207 Auxiliary illumination light source
209 Reflector (reflective portion)
209a Inner surface
209b and 251 Illumination light opening
209c and 252 Excitation light incident opening
209d and 253 Excitation light emitting opening
209e and 254 Auxiliary illumination light incident opening
211 and 244 Excitation light termination portion
211B Integrating sphere
211C Light absorbing member
211a Opening
211b Closed-end cylindrical part
211c Tapered part
211d Heat dissipation fin
211e Bottom
211f Front end
211g Base end part
211h Inner surface
211i Outer circumferential surface
211j Light incident hole
213 Excitation light cutoff filter
241 Parabola mirror (reflective portion)
242 Metal plate (reflective portion)
243 Metal thin film
C1 Excitation light
C2 Auxiliary illumination light
C3 Non-excitation light
C4 Illumination light
H Illumination direction
L1 Central line

The invention claimed is:

1. A positional deviation detection unit comprising:
 detection means for detecting a relative positional relationship between an excitation light source, an optical member, and a light emitting portion in a light emitting device in which excitation light emitted from the excitation light source is collected at the light emitting portion via the optical member so that the light emitting portion is made to emit light; and
 determination means for comparing a detection result from the detection means with a reference relative positional relationship which is used as a reference for a relative positional relationship between the excitation light source, the optical member, and the light emitting portion, so as to determine whether or not there is a deviation of the relative positional relationship between the excitation light source, the optical member, and the light emitting portion when the detection means performs the detection, from the reference relative positional relationship.

2. The positional deviation detection unit according to claim 1, wherein the reference relative positional relationship is set in advance on the basis of at least one of an area of an irradiation region on the light emitting portion and a position of the irradiation region on the light emitting portion in relation to excitation light collected at the light emitting portion.

3. The positional deviation detection unit according to claim 1, further comprising:
 a laser light source that emits laser light from one of an excitation light source support surface supporting the excitation light source and a light emitting portion support surface supporting the light emitting portion toward the other surface; and
 a light receiving portion that receives return light which is reflected from the other surface and then returns to the one surface, of laser light emitted from the laser light source,
 wherein the detection means acquires a focal shape of the return light on the light receiving portion from the light receiving portion as a result of the detection performed by the detection means, and
 wherein the determination means determines that there is a deviation in a case where a reference focal shape which is a focal shape on the light receiving portion is compared with the focal shape on the light receiving portion, acquired by the detection means, and there is a change between the two focal shapes, when a relative positional relationship between the excitation light source, the optical member, and the light emitting portion is set as the reference relative positional relationship.

4. The positional deviation detection unit according to claim 3, wherein the laser light source is used as the excitation light source of the light emitting device,
 wherein the positional deviation detection unit further includes an optical function filter that blocks light emitted from the light emitting portion and transmits the return light therethrough, and
 wherein the optical function filter is disposed on a light receiving surface side, which receives light, of the light receiving portion.

5. The positional deviation detection unit according to claim 1, further comprising:
 a camera that is disposed in at least one of an excitation light source support member supporting the excitation light source and an optical member support member supporting the optical member; and
 a marker that is included in an imaging region of the camera,
 wherein the marker includes at least one of a marker which is included in an imaging region of a camera disposed in the excitation light source support member and is disposed in the optical member support member and a marker which is included in an imaging region of a camera disposed in the optical member support member and is disposed in a light emitting portion support member supporting the light emitting portion,
 wherein the detection means acquires an imaging result in which the camera captures an image of the marker, as a result of the detection performed by the detection means, and
 wherein the determination means determines that there is a deviation in a case where an imaging result from the camera is compared with the imaging result acquired by the detection means, and there is a change between the two imaging results when a relative positional relationship between the camera and the marker is set as the reference relative positional relationship.

6. A light emitting device comprising:
an excitation light source that emits excitation light;
an optical member that collects the excitation light emitted from the excitation light source;
a light emitting portion that is made to emit light by using the excitation light collected by the optical member;
a positional deviation detection unit that detects a deviation in a relative positional relationship between the excitation light source, the optical member, and the light emitting portion; and
a positional deviation adjustment unit that adjusts the deviation detected by the positional deviation detection unit,
wherein the positional deviation detection unit includes
detection means for detecting a relative positional relationship between the excitation light source, the optical member, and the light emitting portion; and
determination means for comparing a detection result from the detection means with a reference relative positional relationship which is used as a reference for a relative positional relationship between the excitation light source, the optical member, and the light emitting portion, so as to determine whether or not there is a deviation of the relative positional relationship between the excitation light source, the optical member, and the light emitting portion when the detection means performs the detection, from the reference relative positional relationship, and
wherein the positional deviation adjustment unit adjusts a deviation detected by the positional deviation detection unit by returning the relative positional relationship between the excitation light source, the optical member, and the light emitting portion to the reference relative positional relationship when the deviation is detected by the positional deviation detection unit.

7. The light emitting device according to claim 6, wherein the reference relative positional relationship is set in advance on the basis of at least one of an area of an irradiation region on the light emitting portion and a position of the irradiation region on the light emitting portion in relation to excitation light collected at the light emitting portion.

8. The light emitting device according to claim 6, wherein the positional deviation adjustment unit includes a movement mechanism that moves a position of at least one of the excitation light source, the optical member, and the light emitting portion.

9. The light emitting device according to claim 8, wherein the movement mechanism fixes the excitation light source and the light emitting portion in place and moves the optical member.

10. The light emitting device according to 6, further comprising a reflection mirror that reflects light emitted from the light emitting portion,
wherein the excitation light source is a semiconductor laser light source.

11. An illumination apparatus comprising the light emitting device according to claim 6.

12. A projector comprising the light emitting device according to claim 6.

13. A vehicle headlamp comprising the light emitting device according to claim 6.

* * * * *